(12) United States Patent
Choi et al.

(10) Patent No.: US 11,133,479 B2
(45) Date of Patent: Sep. 28, 2021

(54) ORGANIC SOLAR CELL COMPRISING A PHENYLDITHIOPHENE POLYMER DONOR AND A NON-FULLERENE ACCEPTOR

(71) Applicant: LG CHEM, LTD., Seoul (KR)

(72) Inventors: Doowhan Choi, Daejeon (KR); Jiyoung Lee, Daejeon (KR); Bogyu Lim, Daejeon (KR); Songrim Jang, Daejeon (KR); Ji Hoon Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 16/477,415

(22) PCT Filed: Jun. 18, 2018

(86) PCT No.: PCT/KR2018/006834
§ 371 (c)(1),
(2) Date: Jul. 11, 2019

(87) PCT Pub. No.: WO2018/236100
PCT Pub. Date: Dec. 27, 2018

(65) Prior Publication Data
US 2020/0028098 A1    Jan. 23, 2020

(30) Foreign Application Priority Data

Jun. 23, 2017 (KR) .................. 10-2017-0079706

(51) Int. Cl.
*H01L 51/00* (2006.01)
*H01L 51/44* (2006.01)

(52) U.S. Cl.
CPC ...... *H01L 51/0074* (2013.01); *H01L 51/0034* (2013.01); *H01L 51/0068* (2013.01); *H01L 51/0069* (2013.01); *H01L 51/44* (2013.01)

(58) Field of Classification Search
CPC ............. H01L 51/0068; H01L 51/0069; H01L 51/0034; H01L 51/4253; Y02E 10/549
See application file for complete search history.

(56) References Cited

U.S. PATENT DOCUMENTS

| 10,644,241 | B2 * | 5/2020 | Lee ................ H01L 51/0043 |
| 2006/0052612 | A1 | 3/2006 | Stossel et al. |
| 2016/0108317 | A1 | 4/2016 | Kirsch et al. |
| 2018/0033970 | A1 * | 2/2018 | Lee ................ H01L 51/0047 |
| 2018/0175219 | A1 | 6/2018 | Jang et al. |

FOREIGN PATENT DOCUMENTS

| CN | 105524256 | 4/2016 |
| JP | 2016522442 | 9/2016 |
| KR | 1020050042757 | 5/2005 |
| KR | 1020140111946 | 9/2014 |
| KR | 1666353 | 10/2016 |
| KR | 20170067028 A | * 6/2017 |
| KR | 1020170067028 | * 6/2017 |
| KR | 1020170067145 | 6/2017 |
| WO | 2016099218 | 6/2016 |
| WO | WO-2016099218 A2 | * 6/2016 ......... H01L 51/0043 |

OTHER PUBLICATIONS

Lee et al. "Polymer and Organic Solar Cell Comprising the Same" KR 10-20170067028 A (pub. Jun. 15, 2017) English Machine Translation. (Year: 2017).*
Wang et al. "Efficient Fullerene-Free Polymer Solar Cells Based on Alkylthio Substituted Conjugated Polymers" J. Phys. Chem. 2017, 121, 4825-4833. (Year: 2017).*
Livi et al. "Influence of Side Chain Position on the Electrical Properties of Organic Solar Cells Based on Dithienylbenzothiadiazole-altphenylene Conjugated Polymers" Macromolecules 2015, 48, 3481-3492. (Year: 2015).*
English translation of International Search Report corresponding to International Patent Application No. PCT/KR2018/006834 (3 pages) (dated Sep. 20, 2018).
Lin et al. "An Electron Acceptor Challenging Fullerenes for Efficient Polymer Solar Cells" Advanced Materials, 27:1170-1174 (2015).
Liu et al. "A random donor polymer based on an asymmetric building block to tune the morphology of non-fullerene organic solar cells" Journal of Materials Chemistry A, 5(43):22480-22488 (2017).
Livi et al. "Influence of Side Chain Position on the Electrical Properties of Organic Solar Cells Based on Dithienylbenzothiadiazole-alt-phenylene Conjugated Polymers" Macromolecules, 48(11):3481-3492 (2015).
Tang, C. W. "Two-layer organic photovoltaic cell" Applied Physics Letters, 48(2):183-185 (1986).
Yu et al. "Polymer Photovoltaic Cells: Enhanced Efficiencies via a Network of Internal Donor-Acceptor Heterojunctions" Science, 270:1789-1791 (1995).
Zhang et al. "Tuning Energy Levels without Negatively Affecting Morphology: A Promising Approach to Achieving Optimal Energetic Match and Efficient Nonfullerene Polymer Solar Cells" Advanced Energy Materials, 1602119:1-8 (2017).
Extended European Search Report corresponding to European Patent Application No. 18821152.8 (8 pages) (dated Dec. 16, 2019).
Zheng et al. "Efficient Charge Transfer and Fine-Tuned Energy Level Alignment in a THF-Processed Fullerene-Free Organic Solar Cell with 11.3% Efficiency" Advanced Materials, vol. 29, No. 5 (1604241):1-6 (2017).

* cited by examiner

*Primary Examiner* — Amanda L. Aguirre
(74) *Attorney, Agent, or Firm* — Myers Bigel, P.A.

(57) ABSTRACT

The present specification relates to an organic solar cell including a first electrode; a second electrode; and one or more organic material layers including a photoactive layer, wherein the photoactive layer includes an electron donor and an electron acceptor, the electron donor includes a polymer including a first unit represented by Chemical Formula 1; a second unit represented by Chemical Formula 2; and a third unit represented by Chemical Formula 3, and the electron acceptor includes a non-fullerene-based compound.

20 Claims, 4 Drawing Sheets

[FIG. 1]
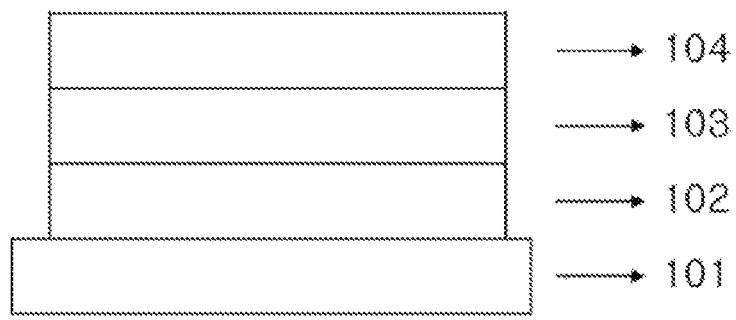
[FIG. 2]
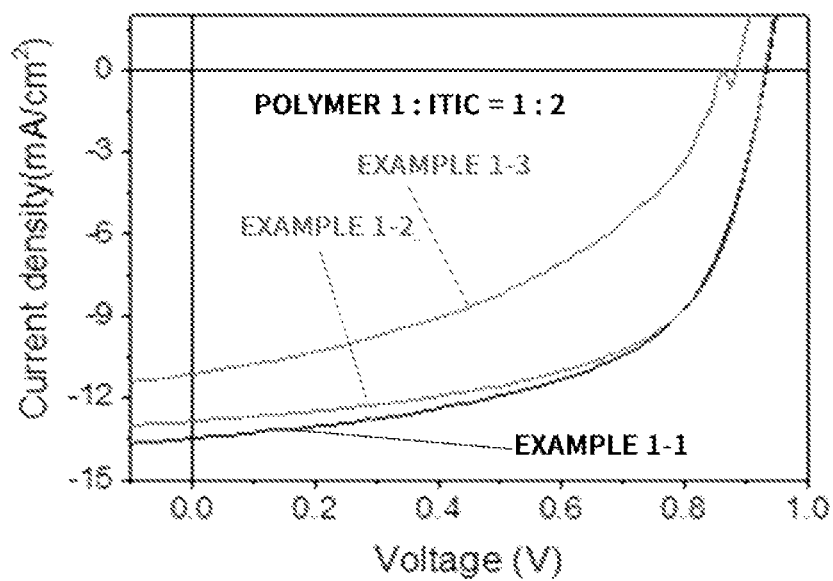

[FIG. 3]
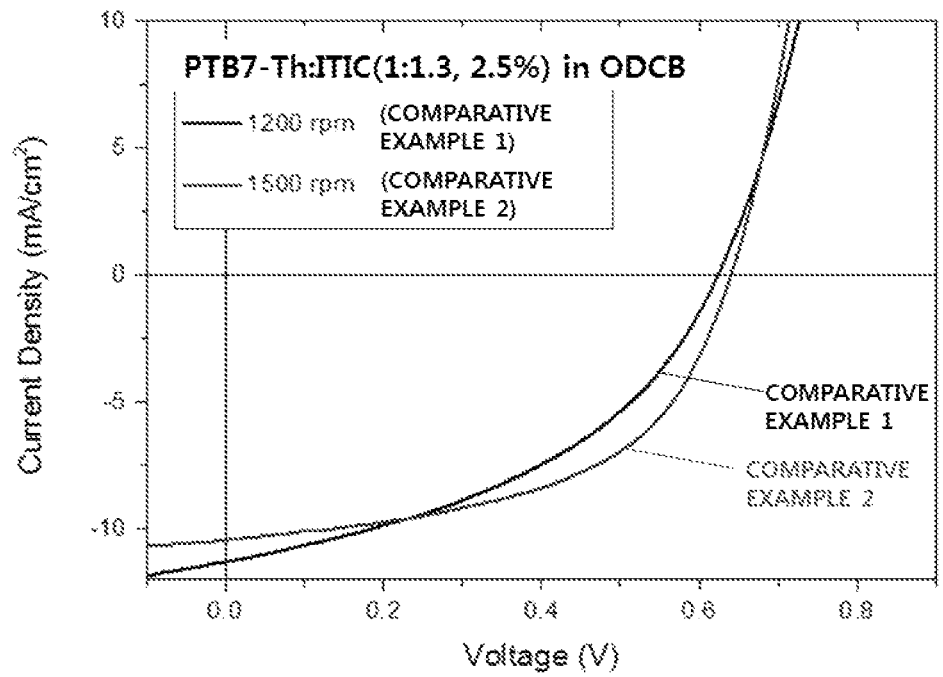
[FIG. 4]
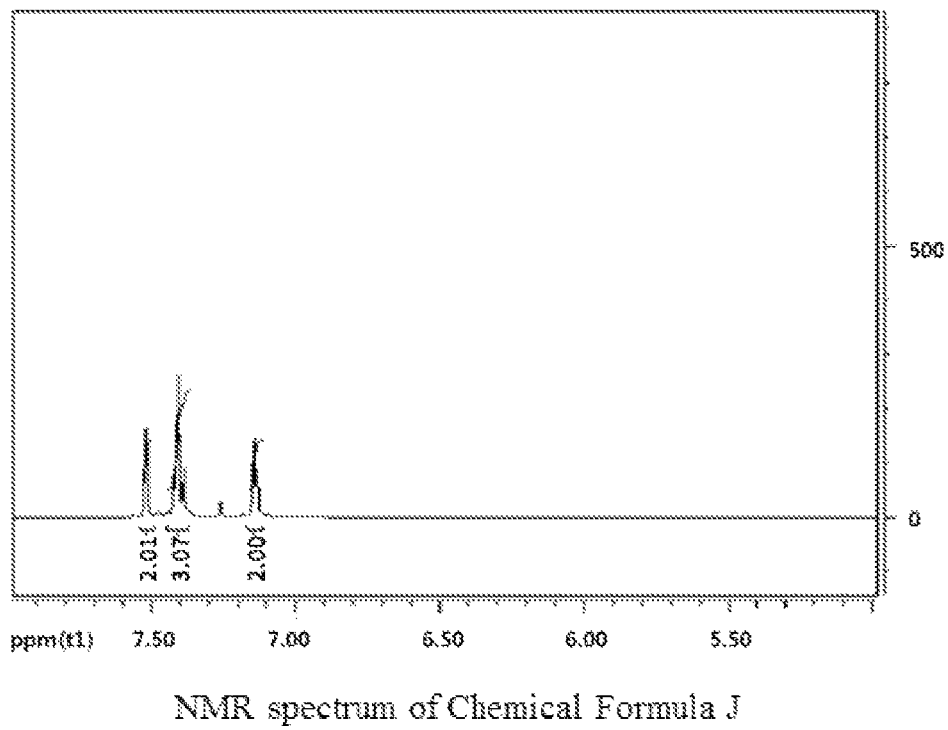
NMR spectrum of Chemical Formula J

[FIG. 5]
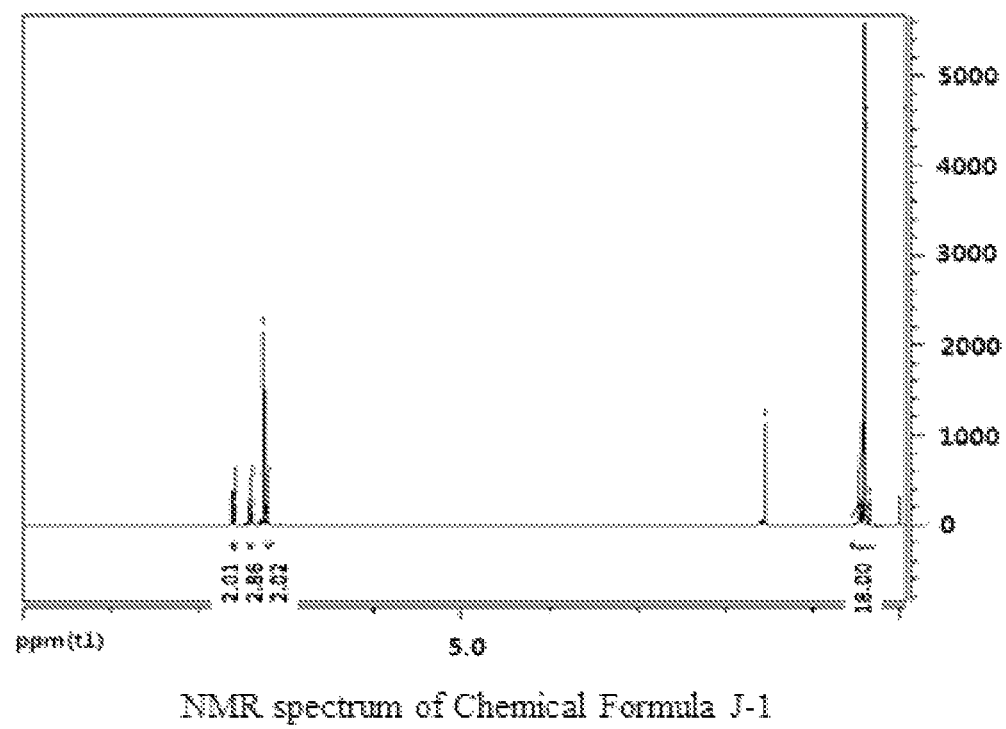
NMR spectrum of Chemical Formula J-1

[FIG. 6]
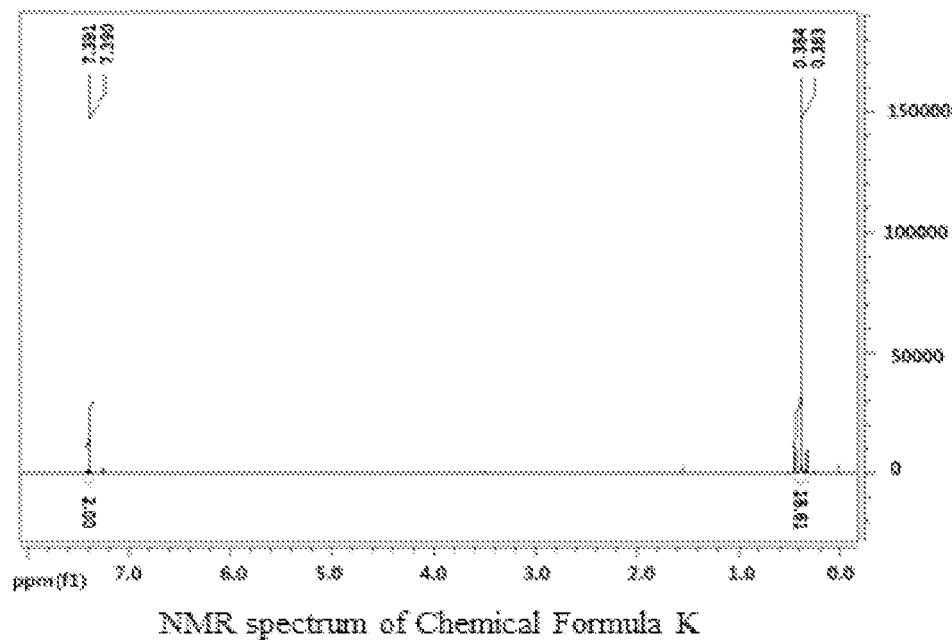
NMR spectrum of Chemical Formula K

ORGANIC SOLAR CELL COMPRISING A PHENYLDITHIOPHENE POLYMER DONOR AND A NON-FULLERENE ACCEPTOR

CROSS REFERENCE TO RELATED APPLICATIONS

This application is a 35 U.S.C. § 371 national stage application of PCT International Application No. PCT/KR2018/006834, filed Jun. 18, 2018, which claims priority from Korean Patent Application No. 10-2017-0079706, filed Jun. 23, 2017, the contents of which are incorporated herein in their entireties by reference. The above-referenced PCT International Application was published in the Korean language as International Publication No. WO 2018/236100 A1 on Dec. 27, 2018.

TECHNICAL FIELD

The present specification relates to an organic solar cell.

BACKGROUND ART

An organic solar cell is a device capable of directly converting solar energy to electric energy by applying a photovoltaic effect. Solar cells are divided into inorganic solar cells and organic solar cells depending on the materials forming a thin film, and since existing inorganic solar cells already have limits in economic feasibility and material supplies, organic solar cells that are readily processed, inexpensive and have various functions have been highly favored as a long-term alternative energy source.

For solar cells, it is important to increase efficiency so as to output as much electric energy as possible from solar energy, and fullerene-based compounds, an existing electron acceptor material, have problems such as having a low absorption rate in a visible region and having low thermal stability.

Accordingly, many examples of an organic solar cell using non-fullerene-based compounds as an electron acceptor material have been reported, and power conversion efficiency thereof has reached approximately 4% to 5.9%. However, non-fullerene-based compounds exhibit favorable efficiency only in combination with specific polymers at present, and therefore, finding novel polymers capable of exhibiting favorable efficiency with non-fullerene-based compounds have been an important challenge.

DISCLOSURE

Technical Problem

The present specification is directed to providing an organic solar cell.

Technical Solution

One embodiment of the present specification provides an organic solar cell including a first electrode; a second electrode disposed opposite to the first electrode; and one or more organic material layers disposed between the first electrode and the second electrode and including a photoactive layer, wherein the photoactive layer includes an electron donor and an electron acceptor, the electron donor includes a polymer including a first unit represented by the following Chemical Formula 1; a second unit represented by the following Chemical Formula 2; and a third unit represented by the following Chemical Formula 3, and the electron acceptor includes a non-fullerene-based compound.

[Chemical Formula 1]

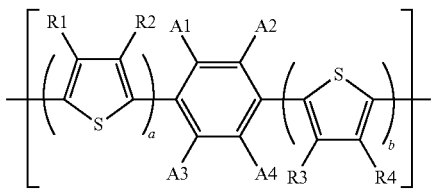

[Chemical Formula 2]

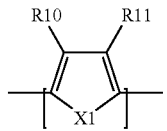

[Chemical Formula 3]

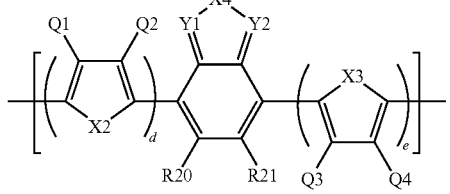

In Chemical Formulae 1 to 3,

X1 to X4 are the same as or different from each other, and each independently selected from the group consisting of CRR', NR, O, SiRR', PR, S, GeRR', Se and Te, Y1 and Y2 are the same as or different from each other, and each independently selected from the group consisting of CR", N, SiR", P and GeR", R, R', R", Q1 to Q4, R1 to R4, R10 and R11 are the same as or different from each other, and each independently hydrogen; deuterium; a halogen group; a nitrile group; a nitro group; an imide group; an amide group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted aryl group; or a substituted or unsubstituted heterocyclic group, R20 and R21 are the same as or different from each other, and each independently a substituted or unsubstituted alkoxy group; or a substituted or unsubstituted aryloxy group, a and b are the same as or different from each other, and each an integer of 1 to 3, d and e are each an integer of 0 to 3, when a, b, d or e is each 2 or greater, structures in the two or more parentheses are the same as or different from each other, and A1 to A4 are the same as or different from each other, and each independently hydrogen, fluorine or chlorine, and at least one of A1 to A4 is fluorine or chlorine.

Advantageous Effects

An organic solar cell according to one embodiment of the present specification uses the polymer as an electron donor, and uses the non-fullerene-based compound as an electron acceptor, and thereby has excellent thermal stability and power conversion efficiency.

In addition, the polymer according to one embodiment of the present specification has a high HOMO energy level, and therefore, the organic solar cell including this polymer as an electron donor of a photoactive layer has an excellent open circuit voltage property.

DESCRIPTION OF DRAWINGS

FIG. 1 is a diagram illustrating an organic solar cell according to one embodiment of the present specification.

FIG. 2 is a diagram presenting voltage-dependent current density of organic solar cells of Examples 1-1 to 1-3.

FIG. 3 is a diagram presenting voltage-dependent current density of organic solar cells of Comparative Examples 1 and 2.

FIG. 4 is a diagram presenting an NMR spectrum of Chemical Formula J synthesized in a preparation example.

FIG. 5 is a diagram presenting an NMR spectrum of Chemical Formula J-1 synthesized in a preparation example.

FIG. 6 is a diagram presenting an NMR spectrum of Chemical Formula K synthesized in a preparation example.

REFERENCE NUMERAL

101: Anode (ITO)
102: Hole Transfer Layer (PEDOT:PSS)
103: Photoactive Layer
104: Cathode (Al)

MODE FOR DISCLOSURE

Hereinafter, the present specification will be described in more detail.

In the present specification, a 'unit' is a repeated structure included in a monomer of a polymer, and means a structure in which the monomer bonds in the polymer by polymerization.

In the present specification, the meaning of 'including a unit' means being included in a main chain in a polymer.

In the present specification, a description of a certain part 'including' certain constituents means capable of further including other constituents, and does not exclude other constituents unless particularly stated on the contrary.

In the present specification, a description of one member being placed 'on' another member includes not only a case of the one member adjoining the another member but a case of still another member being present between the two members.

In the present specification, an energy level means magnitude of energy. Accordingly, even when an energy level is expressed in a negative (−) direction from a vacuum level, the energy level is interpreted to mean an absolute value of the corresponding energy value. For example, a HOMO energy level means a distance from a vacuum level to a highest occupied molecular orbital. In addition, a LUMO energy level means a distance from a vacuum level to a lowest unoccupied molecular orbital.

One embodiment of the present specification provides an organic solar cell including a first electrode; a second electrode disposed opposite to the first electrode; and one or more organic material layers disposed between the first electrode and the second electrode and including a photoactive layer, wherein the photoactive layer includes an electron donor and an electron acceptor, the electron donor includes a polymer including a first unit represented by Chemical Formula 1; a second unit represented by Chemical Formula 2; and a third unit represented by Chemical Formula 3, and the electron acceptor includes a non-fullerene-based compound.

In a photoactive layer of an organic solar cell, an electron donor and an electron acceptor absorb light to form excitons, and the produced excitons migrate to an interface of the electron donor and electron acceptor, and are separated into electrons and holes. The electrons migrate along the electron acceptor and the holes migrate along the electron donor to each electrode to produce a current. Herein, how well morphology of the electron donor and the electron acceptor is electrically formed has decisive effects on current generation, and the polymer forms morphology particularly well with non-fullerene-based compounds ultimately enhancing efficiency of an organic solar cell.

Examples of the substituents are described below, however, the substituents are not limited thereto.

The term 'substitution' means a hydrogen atom bonding to a carbon atom of a compound is changed to another substituent, and the position of substitution is not limited as long as it is a position at which the hydrogen atom is substituted, that is, a position at which a substituent can substitute, and when two or more substituents substitute, the two or more substituents may be the same as or different from each other.

The term 'substituted or unsubstituted' in the present specification means being substituted with one or more substituents selected from the group consisting of deuterium; a halogen group; a nitrile group; a nitro group; a hydroxyl group; a substituted or unsubstituted alkyl group; a substituted or unsubstituted cycloalkyl group; a substituted or unsubstituted alkoxy group; a substituted or unsubstituted aryloxy group; a substituted or unsubstituted alkenyl group; a substituted or unsubstituted aryl group; and a substituted or unsubstituted heterocyclic group, or being substituted with a substituent linking two or more substituents among the substituents illustrated above, or having no substituents. For example, 'a substituent linking two or more substituents' may include a biphenyl group. In other words, a biphenyl group may be an aryl group, or interpreted as a substituent linking two phenyl groups.

In the present specification, examples of the halogen group include fluorine, chlorine, bromine or iodine.

In the present specification, the alkyl group may be linear or branched, and although not particularly limited thereto, the number of carbon atoms is preferably from 1 to 50. Specific examples thereof may include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylhexyl, 4-methylhexyl, 5-methylhexyl and the like, but are not limited thereto.

In the present specification, the cycloalkyl group is not particularly limited, but preferably has 3 to 60 carbon atoms, and specific examples thereof may include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl and the like, but are not limited thereto.

In the present specification, the alkoxy group may be linear, branched or cyclic. The number of carbon atoms of the alkoxy group is not particularly limited, but is preferably from 1 to 20. Specific examples thereof may include methoxy, ethoxy, n-propoxy, isopropoxy, 1-propyloxy, n-butoxy, isobutoxy, tert-butoxy, sec-butoxy, n-pentyloxy, neopentyloxy, isopentyloxy, n-hexyloxy, 3,3-dimethylbutyloxy, 2-ethylbutyloxy, n-octyloxy, n-nonyloxy, n-decyloxy, benzyloxy, p-methylbenzyloxy and the like, but are not limited thereto.

In the present specification, the alkenyl group may be linear or branched, and although not particularly limited thereto, the number of carbon atoms is preferably from 2 to 40. Specific examples thereof may include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group and the like, but are not limited thereto.

In the present specification, when the aryl group is a monocyclic aryl group, the number of carbon atoms is not particularly limited, but is preferably from 6 to 25. Specific examples of the monocyclic aryl group may include a phenyl group, a biphenyl group, a terphenyl group and the like, but are not limited thereto.

In the present specification, when the aryl group is a polycyclic aryl group, the number of carbon atoms is not particularly limited, but is preferably from 10 to 24. Specific examples of the polycyclic aryl group may include a naphthyl group, an anthracenyl group, a phenanthryl group, a pyrenyl group, a perylenyl group, a chrysenyl group, a fluorenyl group and the like, but are not limited thereto.

In the present specification, the fluorenyl group may be substituted, and adjacent substituents may bond to each other to form a ring.

In the present specification, the arylene group means the aryl group having two bonding sites, that is, a divalent group. Descriptions on the aryl group provided above may be applied thereto except for these each being divalent.

In the present specification, the heterocyclic group is a group including one or more atoms that are not carbon, that is, heteroatoms, and specifically, the heteroatom may include one or more atoms selected from the group consisting of O, N, Se, S and the like. The number of carbon atoms of the heterocyclic group is not particularly limited, but is preferably from 2 to 60. Examples of the heterocyclic group may include a thiophene group, a furan group, a pyrrole group, an imidazole group, a thiazole group, an oxazole group, an oxadiazole group, a triazole group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a phenothiazinyl group, a dibenzofuranyl group and the like, but are not limited thereto.

In the present specification, the aryl group of the aryloxy group is the same as the examples of the aryl group described above. Specific examples of the aryloxy group may include phenoxy, p-tolyloxy, m-tolyloxy, 3,5-dimethylphenoxy, 2,4,6-trimethylphenoxy, p-tert-butylphenoxy, 3-biphenyloxy, 4-biphenyloxy, 1-naphthyloxy, 2-naphthyloxy, 4-methyl-1-naphthyloxy, 5-methyl-2-naphthyloxy, 1-anthryloxy, 2-anthryloxy, 9-anthryloxy, 1-phenanthryloxy, 3-phenanthryloxy, 9-phenanthryloxy and the like, but are not limited thereto.

In one embodiment of the present specification, the non-fullerene-based compound may be represented by the following Chemical Formula A.

[Chemical Formula A]

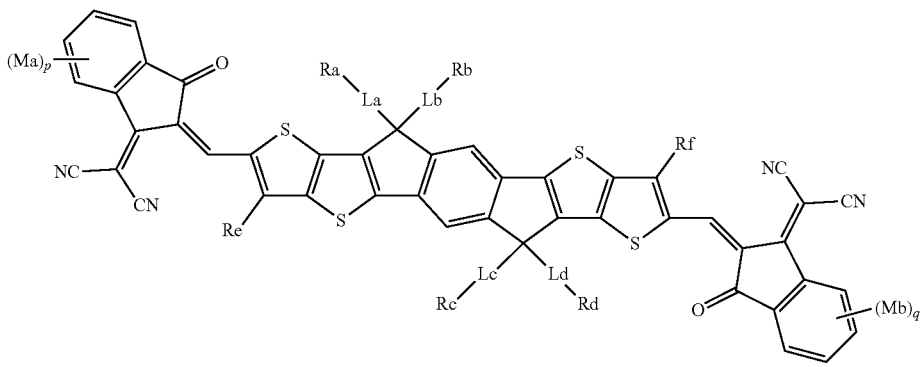

In Chemical Formula A,

Ra to Rf are the same as or different from each other, and each independently hydrogen; or a substituted or unsubstituted alkyl group, La to Ld are the same as or different from each other, and each independently a substituted or unsubstituted arylene group; or a substituted or unsubstituted divalent heterocyclic group, Ma and Mb are the same as or different from each other, and each independently hydrogen; a halogen group; or a substituted or unsubstituted alkyl group, p and q are the same as or different from each other, and each independently an integer of 0 to 2, and when p or q is each 2, structures in the parentheses are the same as each other.

In one embodiment of the present specification, Ra to Rd are each an alkyl group.

In another embodiment, Ra to Rd are each an alkyl group having 1 to 30 carbon atoms.

In another embodiment, Ra to Rd are each an alkyl group having 1 to 10 carbon atoms.

In one embodiment of the present specification, Re and Rf are hydrogen.

In one embodiment of the present specification, La to Ld are each an arylene group.

In another embodiment, La to Ld are each an arylene group having 6 to 25 carbon atoms.

In another embodiment, La to Ld are a phenylene group.

In another embodiment, La to Ld are each a divalent heterocyclic group.

In another embodiment, La to Ld are each a divalent heterocyclic group having 2 to 30 carbon atoms.

In another embodiment, La to Ld are each a divalent heterocyclic group having 2 to 10 carbon atoms.

In another embodiment, La to Ld are a divalent thiophene group.

In one embodiment of the present specification, Ma and Mb are hydrogen.

In another embodiment, Ma and Mb are each an alkyl group.

In another embodiment, Ma and Mb are each an alkyl group having 1 to 10 carbon atoms.

In another embodiment, Ma and Mb are a methyl group.

In another embodiment, Ma and Mb are each a halogen group.

In another embodiment, Ma and Mb are fluorine.

In one embodiment of the present specification, p and q are each 0.

In another embodiment, p and q are each 1.

In another embodiment, p and q are each 2.

In addition, in one embodiment of the present specification, the compound represented by Chemical Formula A may be any one of the following Chemical Formulae A-1 to A-5.

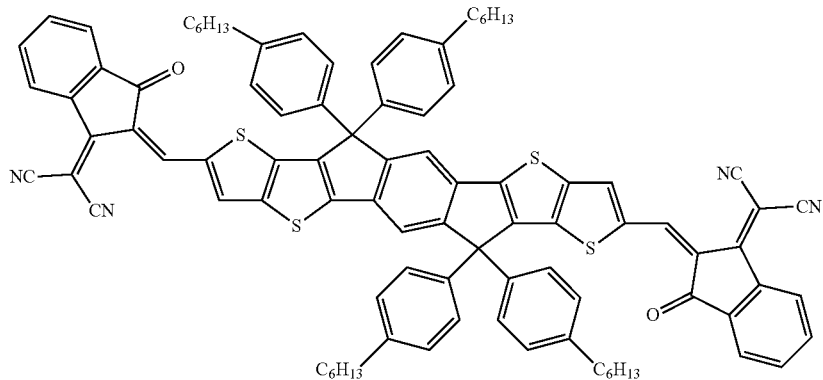

[Chemical Formula A-1]

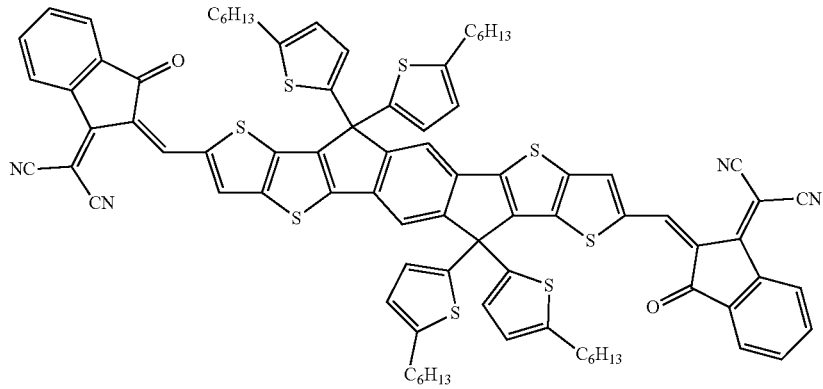

[Chemical Formula A-2]

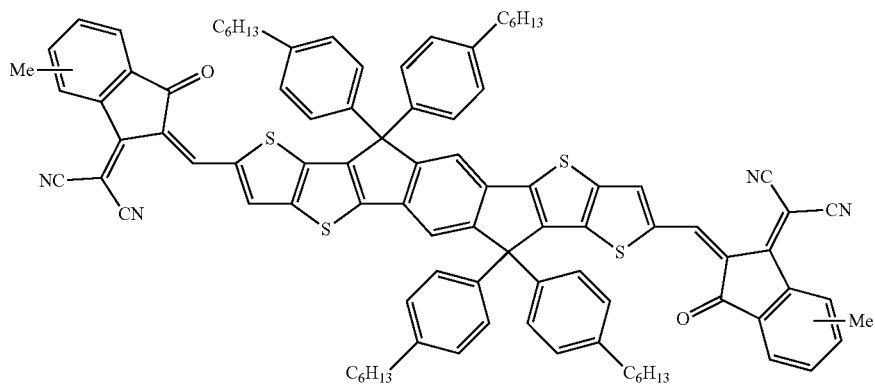

[Chemical Formula A-3]

-continued

[Chemical Formula A-4]

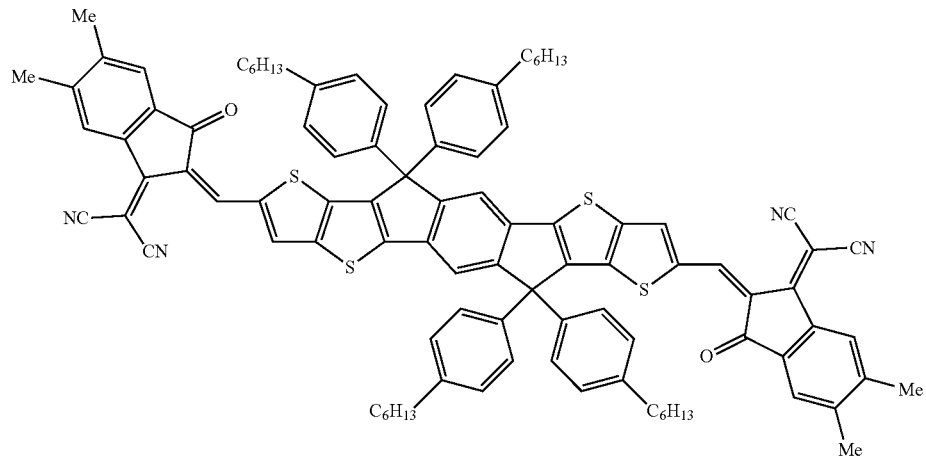

[Chemical Formula A-5]

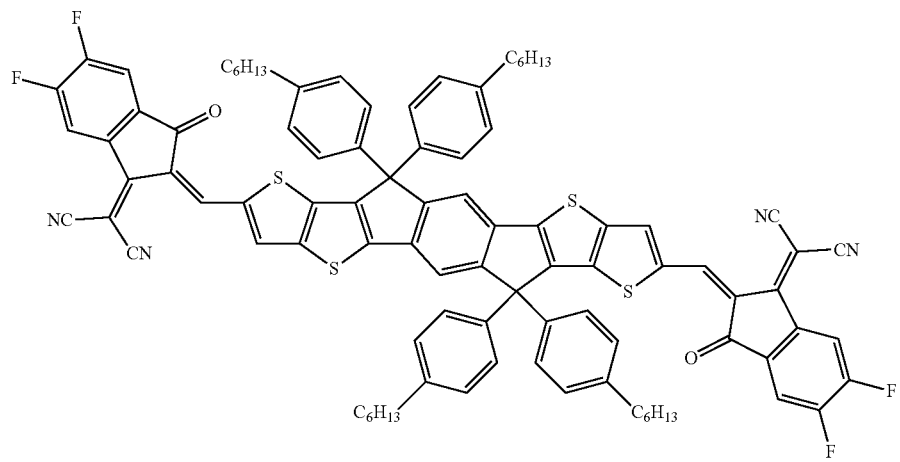

In the present specification, Me means a methyl group.

In one embodiment of the present specification, the non-fullerene-based compound has higher thermal stability compared to fullerene-based compounds.

In addition, in one embodiment of the present specification, an organic solar cell including the non-fullerene-based compound as an electron acceptor of a photoactive layer and including the polymer as an electron donor of a photoactive layer has excellent thermal stability and has excellent power conversion efficiency.

The polymer according to one embodiment of the present specification includes the first unit represented by Chemical Formula 1.

In one embodiment of the present specification, two groups of A1 to A4 are each fluorine or chlorine, and may substitute at a position opposite to each other in the benzene ring, that is, a para position. In this case, fluorine or chlorine of the first unit interacts with an S atom of thiophene of the first unit to increase planarity of the polymer.

In one embodiment of the present specification, A1 to A4 are the same as or different from each other and each independently hydrogen, fluorine or chlorine, and at least one of A1 to A4 is fluorine or chlorine.

In one embodiment of the present specification, at least one of A1 to A4 is fluorine.

In one embodiment of the present specification, two groups of A1 to A4 are each fluorine or chlorine, and the two groups may be present at an ortho or para position to each other with respect to the benzene ring.

In one embodiment of the present specification, A1 and A4 are each fluorine, and A2 and A3 are each hydrogen.

In one embodiment of the present specification, A2 and A3 are each fluorine, and A1 and A4 are each hydrogen.

In one embodiment of the present specification, A1 and A2 are each fluorine, and A3 and A4 are each hydrogen.

In one embodiment of the present specification, A1 is fluorine, and A2 to A4 are each hydrogen.

In one embodiment of the present specification, A1 to A4 are each fluorine.

In one embodiment of the present specification, a is 1.

In another embodiment, b is 1.

In one embodiment of the present specification, R1 is hydrogen.

In another embodiment, R2 is hydrogen.

In another embodiment, R3 is hydrogen.

In one embodiment of the present specification, R4 is hydrogen.

The polymer according to one embodiment of the present specification includes the second unit represented by Chemical Formula 2.

In one embodiment of the present specification, X1 is S.

In one embodiment of the present specification, R10 is hydrogen.

In another embodiment, R11 is hydrogen.

In one embodiment of the present specification, the second unit represented by Chemical Formula 2 may be represented by the following Chemical Formula 2-1.

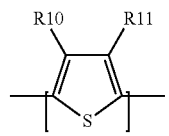

[Chemical Formula 2-1]

In Chemical Formula 2-1,

R10 and R11 have the same definitions as in Chemical Formula 2.

In this case, interactions with fluorine or chlorine of the first unit represented by Chemical Formula 1 according to one embodiment of the present specification may be further expected.

The polymer according to one embodiment of the present specification includes the third unit represented by Chemical Formula 3.

In one embodiment of the present specification, X2 is S.
In another embodiment, X3 is S.
In one embodiment of the present specification, X4 is S.
In one embodiment of the present specification, Y1 is N.
In another embodiment, Y2 is N.
In another embodiment, d is 0.
In another embodiment, d is 1.
In one embodiment of the present specification, e is 1.
In another embodiment, e is 0.
In one embodiment of the present specification, Q1 is hydrogen.
In one embodiment of the present specification, Q2 is hydrogen.
In one embodiment of the present specification, Q3 is hydrogen.
In one embodiment of the present specification, Q4 is hydrogen.

In one embodiment of the present specification, R20 and R21 of the third unit represented by Chemical Formula 3 are the same as or different from each other, and each independently a substituted or unsubstituted alkoxy group; or a substituted or unsubstituted aryloxy group. In this case, packing between molecules may be enhanced through interactions between an O atom of R20 and R21; fluorine or chlorine of the first unit represented by Chemical Formula 1; and an S atom of the second unit represented by Chemical Formula 2.

Accordingly, including the polymer according to one embodiment of the present specification may induce an increase in the fill factor (FF), and a device with high efficiency may be provided.

In the present specification, the interaction means a chemical structure or atoms forming the chemical structure having non-covalent interactions affected by each other through actions other than covalent bonding, and for example, may mean chalcogen bonding.

The polymer according to one embodiment of the present specification may have its planarity enhanced by minimizing a torsion angle of a backbone of the polymer through non-covalent interactions within the unit or with other neighboring units. In addition, non-covalent interactions enhance 7c-it stacking, and thereby enhance charge mobility due to delocalization of polarons and excitons, which is effective in packing.

In one embodiment of the present specification, R20 and R21 are the same as or different from each other, and each independently a substituted or unsubstituted alkoxy group.

In another embodiment, R20 and R21 are the same as or different from each other, and each independently a substituted or unsubstituted alkoxy group having 1 to 20 carbon atoms.

In another embodiment, R20 and R21 are the same as or different from each other, and each independently a substituted or unsubstituted dodecyloxy group.

In one embodiment of the present specification, R20 and R21 are a dodecyloxy group. In one embodiment of the present specification, R20 and R21 are an ethylhexyloxy group.

In one embodiment of the present specification, the third unit represented by Chemical Formula 3 is represented by the following Chemical Formula 3-1 or Chemical Formula 3-2.

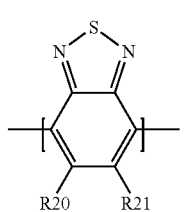

[Chemical Formula 3-1]

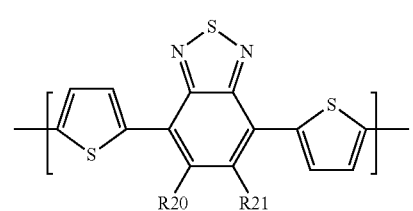

[Chemical Formula 3-2]

In Chemical Formula 3-1 and Chemical Formula 3-2,

R20 and R21 have the same definitions as in Chemical Formula 3.

In one embodiment of the present specification, the polymer includes a unit represented by the following Chemical Formula 4.

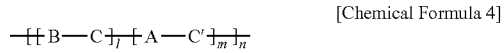

[Chemical Formula 4]

In Chemical Formula 4, l is, as a mole fraction, a real number of $0<l<1$, m is, as a mole fraction, a real number of $0<m<1$, $l+m=1$, A is the first unit represented by Chemical Formula 1, B is the second unit represented by Chemical Formula 2, C and C' are the same as or different from each other, and each independently the third unit represented by Chemical Formula 3, and n is, as a unit repetition number, an integer of 1 to 10,000.

In one embodiment of the present specification, A of Chemical Formula 4 is the first unit represented by Chemical Formula 1, and a and b are each independently an integer of 1 to 3, and preferably 1.

In one embodiment of the present specification, B of Chemical Formula 4 is the second unit represented by Chemical Formula 2-1.

In one embodiment of the present specification, C and C' of Chemical Formula 4 are the third unit represented by Chemical Formula 3-1.

In one embodiment of the present specification, the polymer includes a unit represented by any one of the following Chemical Formulae 5-1 to 5-4.

In one embodiment of the present specification, R22 to R25 are each an alkyl group.

In another embodiment, R22 to R25 are each an alkyl group having 1 to 15 carbon atoms.

In another embodiment, R22 to R25 are each an alkyl group having 1 to 15 carbon atoms.

[Chemical Formula 5-1]

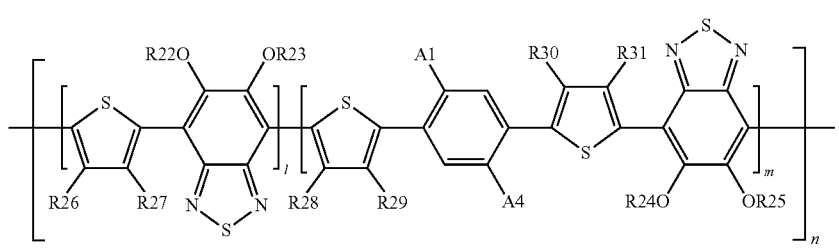

[Chemical Formula 5-2]

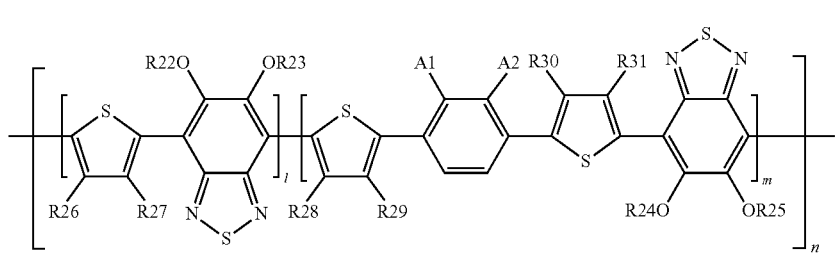

[Chemical Formula 5-3]

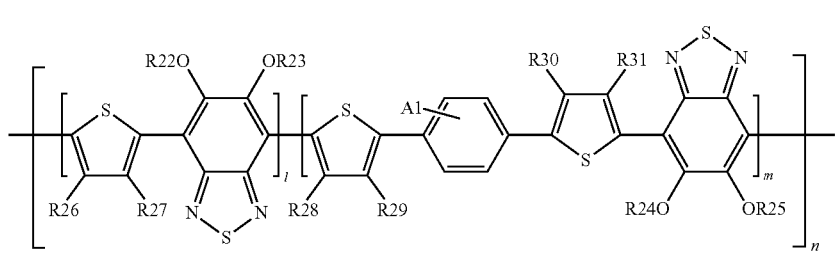

[Chemical Formula 5-4]

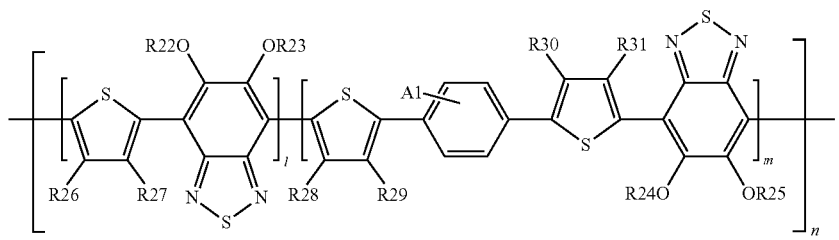

In Chemical Formulae 5-1 to 5-4,

R22 to R25 are the same as or different from each other, and each independently a substituted or unsubstituted alkyl group; or a substituted or unsubstituted aryl group, R26 to R31 are the same as or different from each other, and each independently hydrogen; or a substituted or unsubstituted alkyl group, A1 to A4 have the same definitions as in Chemical Formula 1, l is, as a mole fraction, a real number of $0<l<1$, m is, as a mole fraction, a real number of $0<m<1$, $l+m=1$, and n is, as a unit repetition number, an integer of 1 to 10,000.

In another embodiment, R22 to R25 are each a dodecyl group.

In another embodiment, R22 to R25 are each an ethylhexyl group.

In one embodiment of the present specification, R26 to R31 are hydrogen.

In one embodiment of the present specification, A1 to A4 are each fluorine.

In one embodiment of the present specification, l is 0.5.

In another embodiment, m is 0.5.

In one embodiment of the present specification, the polymer includes a unit represented by any one of the following Chemical Formulae 6-1 to 6-5.

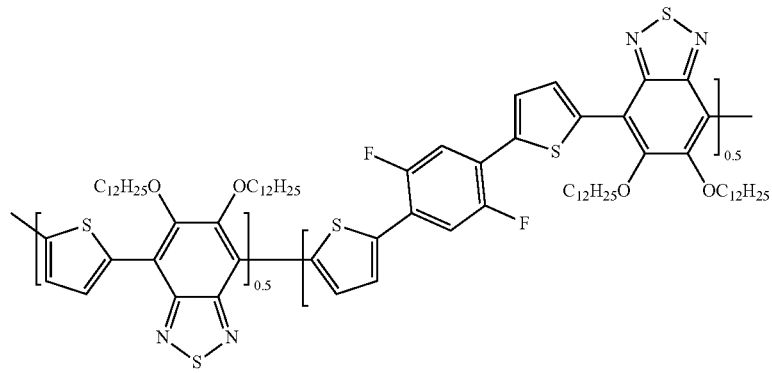

[Chemical Formula 6-1]

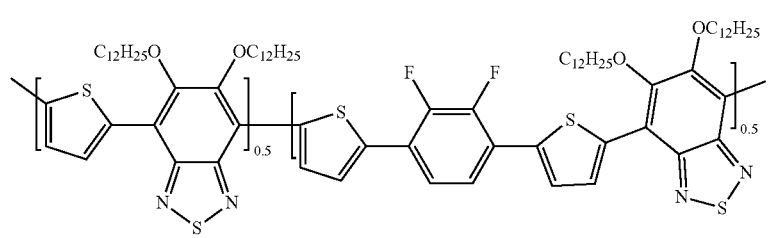

[Chemical Formula 6-2]

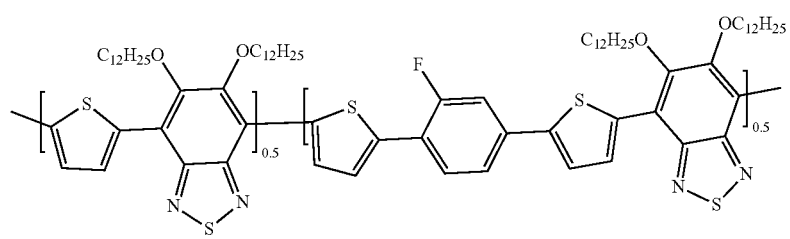

[Chemical Formula 6-3]

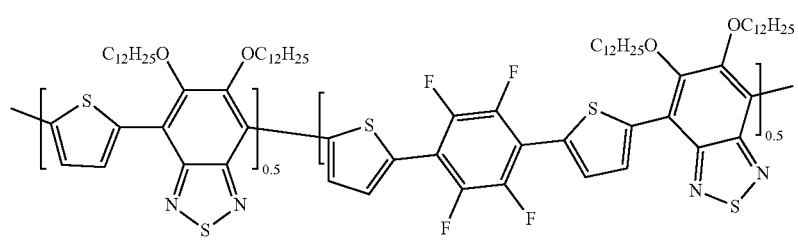

[Chemical Formula 6-4]

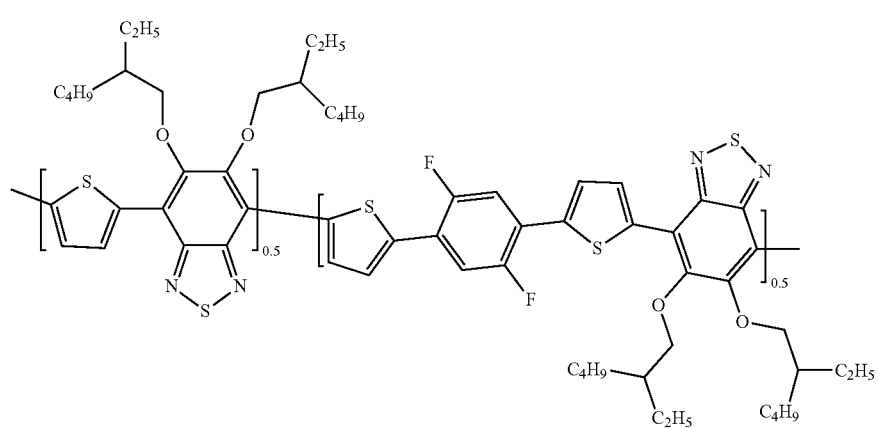

[Chemical Formula 6-5]

In one embodiment of the present specification, the polymer is a random polymer. In addition, when the polymer is a random polymer, solubility is enhanced, which is economically effective cost-wise in terms of a device manufacturing process.

In one embodiment of the present specification, an end group of the polymer is a substituted or unsubstituted heterocyclic group; or a substituted or unsubstituted aryl group.

In one embodiment of the present specification, an end group of the polymer is a 4-(trifluoromethyl)phenyl group.

In one embodiment of the present specification, an end group of the polymer is a bromo-thiophene group.

In another embodiment, an end group of the polymer is a trifluoro-benzene group.

In one embodiment of the present specification, the electron donor is a polymer including the first unit represented by Chemical Formula 1; the second unit represented by Chemical Formula 2; and the third unit represented by Chemical Formula 3, and the electron acceptor is a non-fullerene-based compound.

In another embodiment, the electron donor is a polymer including the unit represented by Chemical Formula 5, and the electron acceptor is the compound represented by Chemical Formula A-1.

In one embodiment of the present specification, the electron donor and the electron acceptor have a mass ratio of 1:1 to 1:4. The ratio is preferably from 1:1.5 to 1:2.5, and more preferably from 1:1.8 to 1:2.2.

According to one embodiment of the present specification, the polymer preferably has a number average molecular weight of 5,000 g/mol to 1,000,000 g/mol.

According to one embodiment of the present specification, the polymer may have molecular weight distribution of 1 to 10. The polymer preferably has molecular weight distribution of 1 to 3.

Electrical properties and mechanical properties become better as the molecular weight distribution decreases and the number average molecular weight increases.

In addition, the number average molecular weight is preferably 100,000 g/mol or less so that a solution coating method is favorably used by having solubility of certain level or higher.

The polymer may be prepared by introducing monomers of each unit with $Pd_2(dba)_3$ and $P(o-tolyl)_3$ with chlorobenzene as a solvent, and polymerizing the result using a microwave reactor.

The polymer according to the present specification may be prepared through a multi-step chemical reaction. After preparing monomers through an alkylation reaction, a Grignard reaction, a Suzuki coupling reaction, a Stille coupling reaction and the like, final polymers may be prepared through a carbon-carbon coupling reaction such as a Stille coupling reaction. When a substituent to introduce is a boronic acid or boronic ester compound, the polymer may be prepared through a Suzuki coupling reaction, and when a substituent to introduce is a tributyltin or trimethyltin compound, the polymer may be prepared through a Stille coupling reaction, however, the preparation is not limited thereto.

An organic solar cell according to one embodiment of the present specification includes a first electrode, a photoactive layer and a second electrode. The organic solar cell may further include a substrate, a hole transfer layer and/or an electron transfer layer.

In one embodiment of the present specification, when the organic solar cell receives photons from an external light source, electrons and holes are generated between an electron donor and an electron acceptor. The generated holes are transferred to an anode through an electron donor layer.

In one embodiment of the present specification, the organic solar cell may further include additional organic material layers. The organic solar cell may reduce the number of organic material layers by using organic materials having various functions at the same time.

In one embodiment of the present specification, the first electrode is an anode, and the second electrode is a cathode. In another embodiment, the first electrode is a cathode, and the second electrode is an anode.

In one embodiment of the present specification, in the organic solar cell, the layers may be arranged in the order of a cathode, a photoactive layer and an anode, or may also be arranged in the order of an anode, a photoactive layer and a cathode, however, the disposition is not limited thereto.

In another embodiment, in the organic solar cell, the layers may be arranged in the order of an anode, a hole transfer layer, a photoactive layer, an electron transfer layer and a cathode, or may also be arranged in the order of a cathode, an electron transfer layer, a photoactive layer, a hole transfer layer and an anode, however, the disposition is not limited thereto.

FIG. 1 is a diagram illustrating an organic solar cell according to one embodiment of the present specification including an anode (101), a hole transfer layer (102), a photoactive layer (103) and a cathode (104).

In one embodiment of the present specification, the organic solar cell has a normal structure. In the normal structure, the layers may be laminated in the order of a substrate, a first electrode, a hole transfer layer, an organic material layer including a photoactive layer, an electron transfer layer and a second electrode.

In one embodiment of the present specification, the organic solar cell has an inverted structure. In the inverted structure, the layers may be laminated in the order of a substrate, a first electrode, an electron transfer layer, an organic material layer including a photoactive layer, a hole transfer layer and a second electrode.

In one embodiment of the present specification, the first electrode is an anode, and the second electrode is a cathode. In another embodiment, the first electrode is a cathode, and the second electrode is an anode.

In one embodiment of the present specification, the organic solar cell has a tandem structure. In this case, the organic solar cell may include two or more layers of photoactive layers. The organic solar cell according to one embodiment of the present specification may have a photoactive layer in one, or two or more layers.

In another embodiment, a buffer layer may be disposed between a photoactive layer and a hole transfer layer, or between a photoactive layer and an electron transfer layer. Herein, a hole injection layer may be further disposed between an anode and the hole transfer layer. In addition, an electron injection layer may be further disposed between a cathode and the electron transfer layer.

In one embodiment of the present specification, the electron donor and the electron acceptor form a bulk heterojunction (BHJ).

A bulk heterojunction means an electron donor material and an electron acceptor material being mixed together in a photoactive layer.

In one embodiment of the present specification, the photoactive layer further includes an additive.

In one embodiment of the present specification, the additive has a molecular weight of 50 g/mol to 300 g/mol.

In another embodiment, the additive is an organic material having a boiling point of 30° C. to 300° C.

In the present specification, the organic material means a material including at least one or more carbon atoms.

In one embodiment, the additive may further include one or more types of additives among additives selected from the group consisting of 1,8-diiodooctane (DIO), 1-chloronaphthalene (1-CN), diphenyl ether (DPE), octanedithiol and tetrabromothiophene.

In one embodiment of the present specification, the photoactive layer has a bilayer structure including an n-type organic material layer and a p-type organic material layer, and the p-type organic material layer includes the polymer.

The substrate in the present specification may include a glass substrate or a transparent plastic substrate having excellent transparency, surface smoothness, handling easiness and water resistance, but is not limited thereto, and substrates typically used in organic solar cells may be used without limit. Specific examples thereof include glass, polyethylene terphthalate (PET), polyethylene naphthalate (PEN), polypropylene (PP), polyimide (PI), triacetyl cellulose (TAC) and the like, but are not limited thereto.

A material of the first electrode may include a material that is transparent and has excellent conductivity, however, the material is not limited thereto. Examples thereof may include metals such as vanadium, chromium, copper, zinc or gold, or alloys thereof; metal oxides such as zinc oxide, indium oxide, indium tin oxide (ITO) or indium zinc oxide (IZO); combinations of metals and oxides such as ZnO:Al or $SnO_2$:Sb; conductive polymers such as poly(3-methylthiophene), poly [3,4-(ethylene-1,2-dioxy)thiophene] (PEDOT), polypyrrole and polyaniline, and the like, but are not limited thereto.

A method of forming the first electrode is not particularly limited, however, a method of, for example, sputtering, E-beam, thermal deposition, spin coating, screen printing, inkjet printing, doctor blade or gravure printing may be used.

When forming the first electrode on a substrate, the result may go through processes of cleaning, dehydrating and modifying to be hydrophilic.

For example, after a patterned ITO substrate is cleaned with a cleaning agent, acetone and isopropyl alcohol (IPA) in consecutive order, the ITO substrate is dried for 1 minute to 30 minutes at 100° C. to 150° C., preferably for 10 minutes at 120° C., on a heating plate in order to dehydrate, and when the substrate is completely cleaned, the surface of the substrate is modified to be hydrophilic.

Through the surface modification such as above, the junctional surface potential may be maintained at a level suitable as surface potential of a photoactive layer. In addition, when a surface is modified, a polymer thin film may be readily formed on a first electrode, and the quality of the thin film may be improved.

Preprocessing technologies for the first electrode include a) a surface oxidation method using parallel plate discharge, b) a method of oxidizing the surface through ozone generated using UV rays in a vacuum state, and c) an oxidation method using oxygen radicals generated by plasma.

One of the methods described above may be selected depending on the condition of the first electrode or the substrate. However, it is commonly preferred to prevent the leave of oxygen on the surface of the first electrode or the substrate and to suppress the remaining of moisture and organic materials as much as possible, no matter which method is used. Practical effects of the preprocessing may be maximized in this case.

As a specific example, a method of oxidizing the surface through ozone generated using UV may be used. Herein, a patterned ITO substrate may be fully dried by baking the patterned ITO substrate on a hot plate after being ultrasonic cleaned, and the patterned ITO substrate is introduced into a chamber and then may be cleaned by the ozone generated by reacting oxygen gas with UV light using a UV lamp.

However, the method of surface modification of the patterned ITO substrate in the present specification is not particularly limited, and any method oxidizing a substrate may be used.

The second electrode may include a metal having small work function, but is not limited thereto. Specific examples thereof may include metals such as magnesium, calcium, sodium, potassium, titanium, indium, yttrium, lithium, gadolinium, aluminum, silver, tin and lead, or alloys thereof; or multilayer-structured materials such as LiF/Al, $LiO_2$/Al, LiF/Fe, Al:Li, Al:$BaF_2$ and Al:$BaF_2$:Ba, but are not limited thereto.

The second electrode may be formed by being deposited inside a thermal depositor having a vacuum degree of $5\times10^{-7}$ torr or less, however, the formation is not limited to this method.

The hole transfer layer and/or the electron transfer layer play a role of efficiently transferring the electrons and the holes separated in a photoactive layer to an electrode, and the material is not particularly limited.

The hole transfer layer material may include poly(3,4-ethylenedioxythiophene) doped with poly(styrenesulfonic acid) (PEDOT:PSS), molybdenum oxide ($MoO_x$); vanadium oxide ($V_2O_5$); nickel oxide (NiO); tungsten oxide ($WO_x$) and the like, but is not limited thereto.

The electron transfer layer material may include electron-extracting metal oxides, and may specifically include a metal complex of 8-hydroxyquinoline; a complex including $Alq_3$; a metal complex including Liq; LiF; Ca; titanium oxide ($TiO_x$); zinc oxide (ZnO); cesium carbonate ($Cs_2CO_3$), and the like, but is not limited thereto.

The photoactive layer may be formed by dissolving a photoactive material such as an electron donor and/or an electron acceptor in an organic solvent, and then applying the solution using a method such as spin coating, dip coating, screen printing, spray coating, doctor blade and brush painting, however, the method is not limited thereto.

Hereinafter, the present specification will be described in detail with reference to examples in order to specifically describe the present specification. However, examples according to the present specification may be modified to various different forms, and the scope of the present specification is not construed as being limited to the examples described below. The examples of the present specification are provided in order to more fully describe the present specification to those having average knowledge in the art.

PREPARATION EXAMPLE

Preparation Example 1

Synthesis of Polymer 1

(1) Synthesis of Chemical Formula J

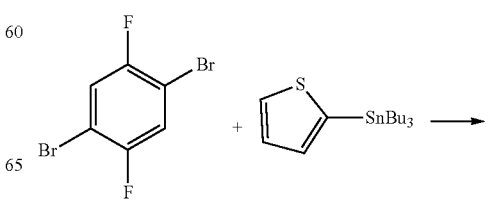

-continued

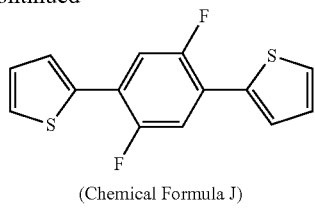

(Chemical Formula J)

After introducing toluene to two starting materials and adding 0.05 equivalents of tetrakis(triphenylphosphine)palladium(0) (Pd(PPh$_3$)$_4$) thereto, the result was stirred for 15 hours at 80° C., and the reaction solution gradually changed to black. This was worked up, dried with magnesium sulfate, and then recrystallized to obtain Chemical Formula J (white powder, 4.3 g).

An NMR spectrum of the synthesized Chemical Formula J is presented in FIG. 4.

(2) Synthesis of Chemical Formula J-1 (First Unit)

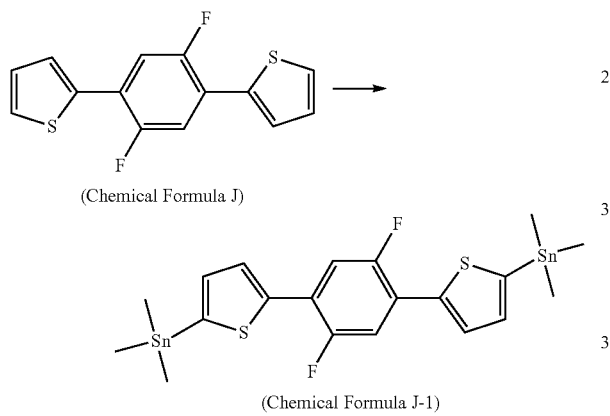

After dissolving the prepared Chemical Formula J in tetrahydrofuran (THF) and lowering the temperature to −78° C., 2.1 equivalents of n-butyllithium (n-BuLi) was added thereto, and the result was stirred for 30 minutes. After that, the result was further stirred for 1 hour at room temperature, and the solution color changed to yellow. The temperature was lowered to −78° C. again, 2.1 equivalents of trimethyltin chloride was added thereto, and the result was stirred for 12 hours while slowly raising the temperature to room temperature. After 12 hours, the solution color changed to ocher, and when crystallizing the result after work up, Chemical Formula J-1 in a glossy plate-type yellow solid form was obtained.

An NMR spectrum of the synthesized Chemical Formula J-1 is presented in FIG. 5.

(3) Synthesis of Chemical Formula K (Second Unit)

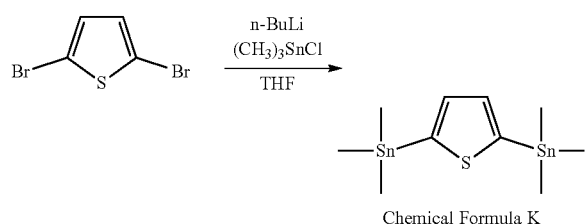

Chemical Formula K

After introducing and dissolving 2,5-dibromothiophene (9.68 g, 40.0 mmol) in 200 ml of tetrahydrofuran (THF), the temperature was lowered to −78° C. At this temperature, 1.6 M n-butyllithium (n-BuLi) dissolved in hexane (55 ml, 88 mmol) was slowly added thereto, and the result was stirred for 1 hour. After that, 1 M trimethyltin chloride dissolved in THF (100 ml, 100 mmol) was introduced thereto at once, the temperature was raised to room temperature, and the result was stirred for 12 hours. This solution was poured into ice, extracted three times with diethyl ether and washed three times with water, and residual water was removed using magnesium sulfate (MgSO$_4$). With the remaining solution, the solvent was removed under decompression, and the result was recrystallized with methanol to obtain white solids.

Yield: 73.1%

FIG. 6 presents an NMR spectrum of the synthesized Chemical Formula K.

(4) Synthesis of Chemical Formula L (Third Unit)

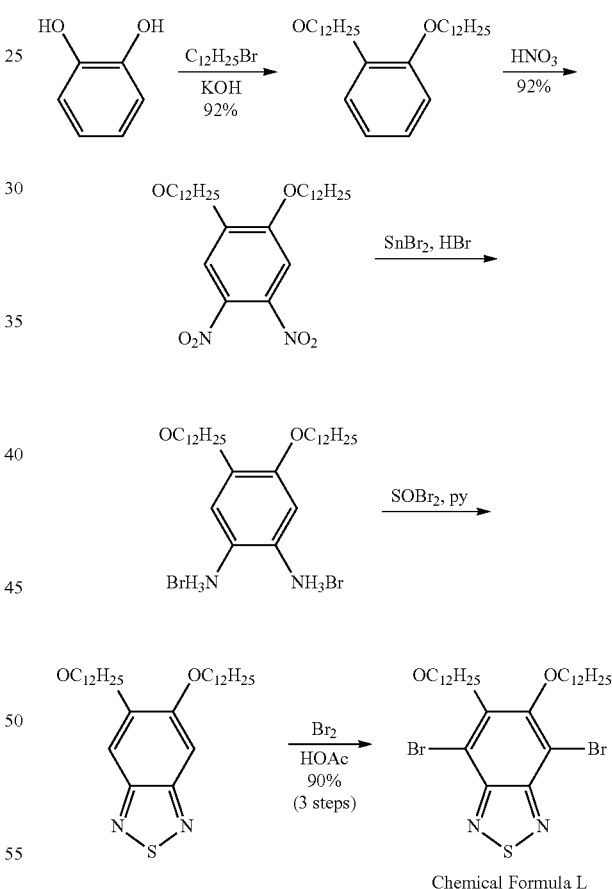

Chemical Formula L

A compound of Chemical Formula L was synthesized based on JOURNAL OF POLYMER SCIENCE PART A: POLYMER CHEMISTRY 2011, 49, 4387-4397, 4389.

(5) Synthesis of Polymer 1

The following Polymer 1 was prepared by, with chlorobenzene as a solvent, introducing the monomers of the first unit to the third unit with Pd$_2$(dba)$_3$ and P(o-tolyl)$_3$, and polymerizing the result using a microwave reactor.

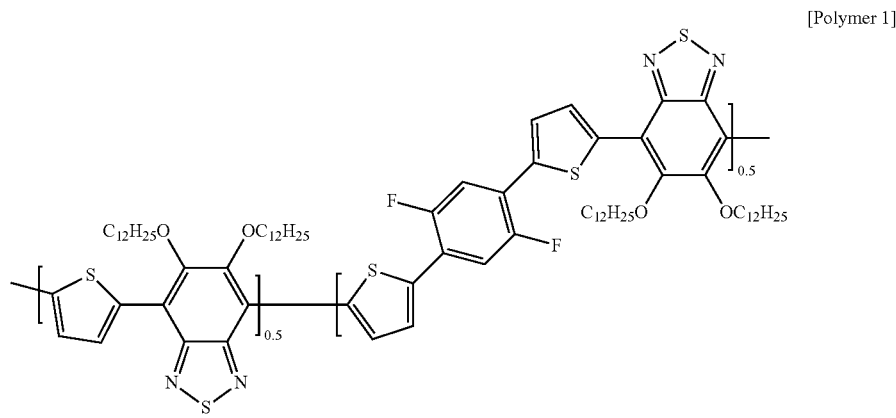

[Polymer 1]

Properties of Polymer 1 are as in the following Table 1.

TABLE 1

| Mn (Number Average Molecular Weight) | Mw (Weight Average Molecular Weight) | PDI (Molecular Weight Distribution, Mw/Mn) | $UV_{edge}$ (Energy Band Gap in Film) |
|---|---|---|---|
| 21,315 | 24,970 | 1.17 | 685.12 |
| $UV_{(s)}$ ($UV_{max}$ in Solution) | $UV_{(f)}$ ($UV_{max}$ in Film) | HOMO Energy Level | LUMO Energy Level |
| 1.82 | 1.81 | 5.53 | 3.72 |

Preparation Example 2. Synthesis of Polymer 2

(1) Synthesis of Chemical Formula M

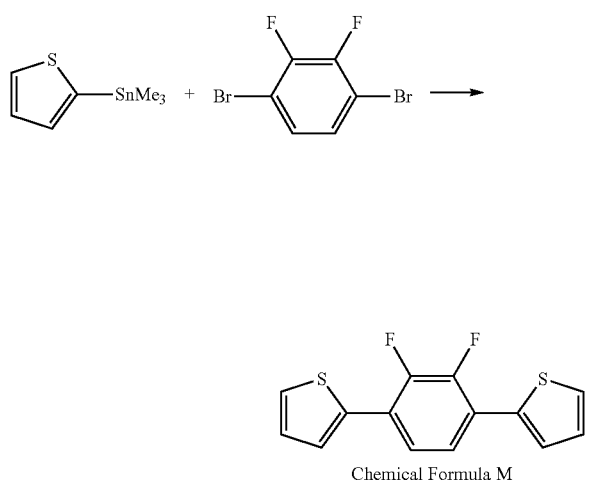

Chemical Formula M

After introducing toluene to two starting materials and adding 0.05 equivalents of tetrakis(triphenylphosphine)palladium(0) (Pd(PPh$_3$)$_4$) thereto, the result was stirred for 15 hours at 80° C., and the reaction solution gradually changed to black. This was worked up, dried with magnesium sulfate, and then recrystallized to obtain Chemical Formula M (white powder, 4.3 g).

(2) Synthesis of Chemical Formula M-1 (First Unit)

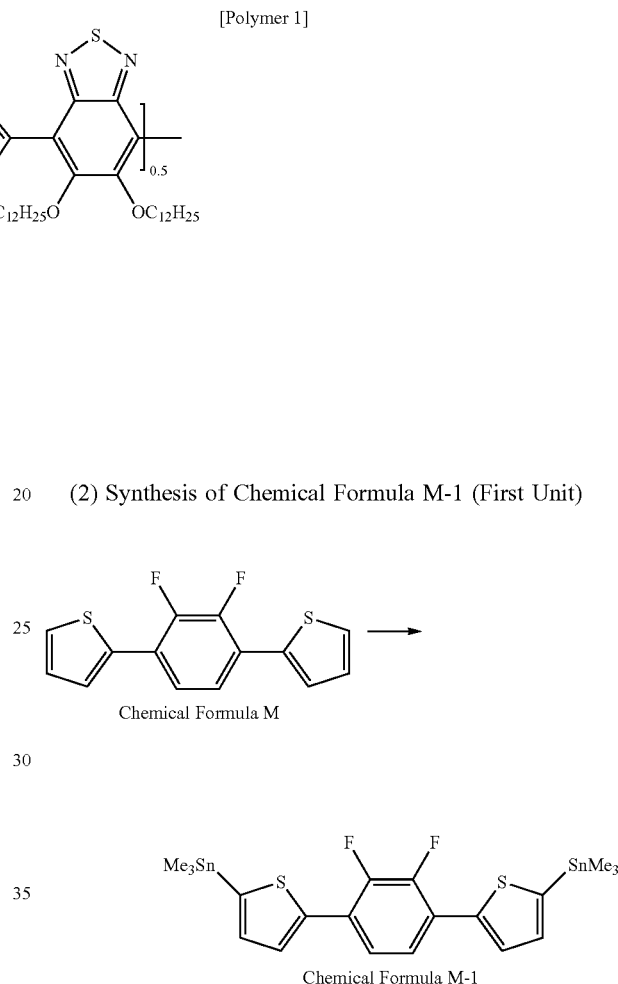

Chemical Formula M

Chemical Formula M-1

After dissolving the prepared Chemical Formula M in tetrahydrofuran (THF) and lowering the temperature to −78° C., 2.1 equivalents of n-butyllithium (n-BuLi) was added thereto, and the result was stirred for 30 minutes. After that, the result was further stirred for 1 hour at room temperature, and the solution color changed to yellow. The temperature was lowered to −78° C. again, 2.1 equivalents of trimethyltin chloride was added thereto, and the result was stirred for 12 hours while slowly raising the temperature to room temperature. After 12 hours, the solution color changed to ocher, and when crystallizing the result after work up, Chemical Formula M-1 in a glossy plate-type yellow solid form was obtained.

(3) Synthesis of Chemical Formula K (Second Unit)

Chemical Formula K was synthesized in the same manner as in (3) of Preparation Example 1.

(4) Synthesis of Chemical Formula L (Third Unit)

Chemical Formula L was synthesized in the same manner as in (4) of Preparation Example 1.

(5) Synthesis of Polymer 2

The following Polymer 2 was prepared by, with chlorobenzene as a solvent, introducing the monomers of the first unit to the third unit with Pd$_2$(dba)$_3$ and P(o-tolyl)$_3$, and polymerizing the result using a microwave reactor.

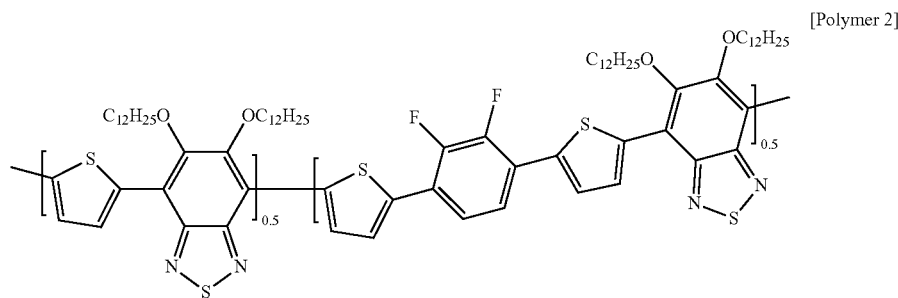

[Polymer 2]

Properties of Polymer 2 are as in the following Table 2.

Preparation Example 3. Synthesis of Polymer 3

(1) Synthesis of Chemical Formula N

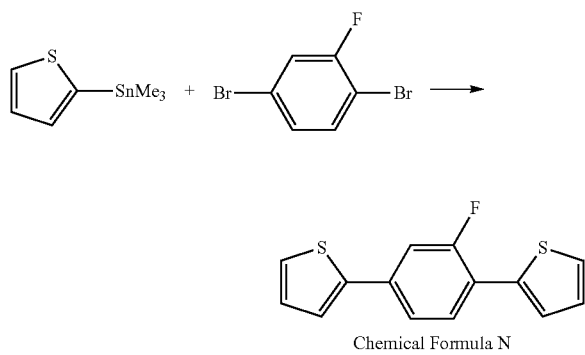

Chemical Formula N

After introducing toluene to two starting materials and adding 0.05 equivalents of tetrakis(triphenylphosphine)palladium(0) (Pd(PPh$_3$)$_4$) thereto, the result was stirred for 15 hours at 80° C., and the reaction solution gradually changed to black. This was worked up, dried with magnesium sulfate, and then recrystallized to obtain Chemical Formula N (white powder, 4.3 g).

(2) Synthesis of Chemical Formula N-1 (First Unit)

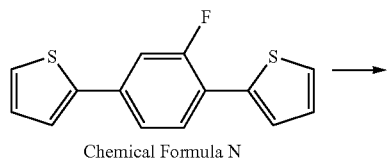

Chemical Formula N

-continued

Chemical Formula N-1

After dissolving the prepared Chemical Formula N in tetrahydrofuran (THF) and lowering the temperature to −78° C., 2.1 equivalents of n-butyllithium (n-BuLi) was added thereto, and the result was stirred for 30 minutes. After that, the result was further stirred for 1 hour at room temperature, and the solution color changed to yellow. The temperature was lowered to −78° C. again, 2.1 equivalents of trimethyltin chloride was added thereto, and the result was stirred for 12 hours while slowly raising the temperature to room temperature. After 12 hours, the solution color changed to ocher, and when crystallizing the result after work up, Chemical Formula N-1 in a glossy plate-type yellow solid form was obtained.

(3) Synthesis of Chemical Formula K (Second Unit)

Chemical Formula K was synthesized in the same manner as in (3) of Preparation Example 1.

(4) Synthesis of Chemical Formula L (Third Unit)

Chemical Formula L was synthesized in the same manner as in (4) of Preparation Example 1.

(5) Synthesis of Polymer 3

The following Polymer 3 was prepared by, with chlorobenzene as a solvent, introducing the monomers of the first unit to the third unit with Pd$_2$(dba)$_3$ and P(o-tolyl)$_3$, and polymerizing the result using a microwave reactor.

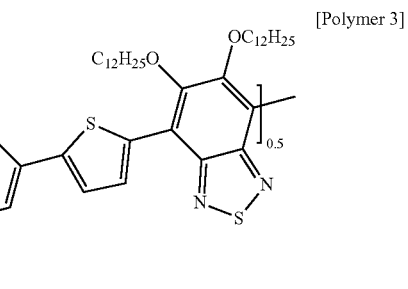

[Polymer 3]

Properties of Polymer 3 are as in the following Table 2.

Preparation Example 4

Synthesis of Polymer 4

(1) Synthesis of Chemical Formula J

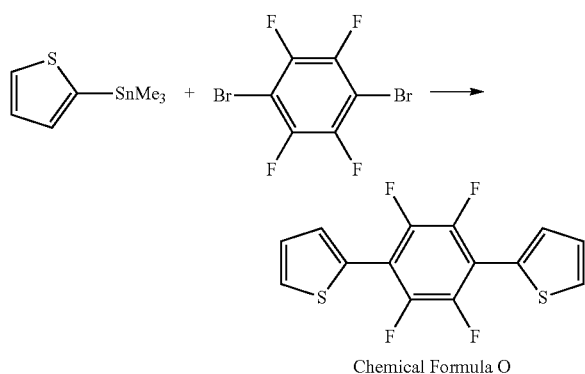

Chemical Formula O

After introducing toluene to two starting materials and adding 0.05 equivalents of tetrakis(triphenylphosphine)palladium(0) (Pd(PPh$_3$)$_4$) thereto, the result was stirred for 15 hours at 80° C., and the reaction solution gradually changed to black. This was worked up, dried with magnesium sulfate, and then recrystallized to obtain Chemical Formula O (white powder, 4.3 g).

(2) Synthesis of Chemical Formula 0-1 (First Unit)

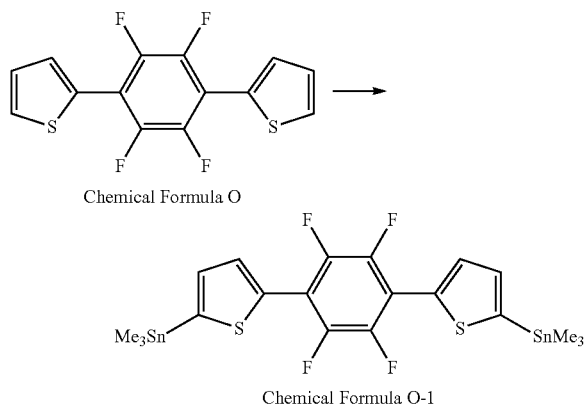

Chemical Formula O

Chemical Formula O-1

After dissolving the prepared Chemical Formula 0 in tetrahydrofuran (THF) and lowering the temperature to 31 78° C., 2.1 equivalents of n-butyllithium (n-BuLi) was added thereto, and the result was stirred for 30 minutes. After that, the result was further stirred for 1 hour at room temperature, and the solution color changed to yellow. The temperature was lowered to −78° C. again, 2.1 equivalents of trimethyltin chloride was added thereto, and the result was stirred for 12 hours while slowly raising the temperature to room temperature. After 12 hours, the solution color changed to ocher, and when crystallizing the result after work up, Chemical Formula -1 in a glossy plate-type yellow solid form was obtained.

(3) Synthesis of Chemical Formula K (Second Unit)

Chemical Formula K was synthesized in the same manner as in (3) of Preparation Example 1.

(4) Synthesis of Chemical Formula L (Third Unit)

Chemical Formula L was synthesized in the same manner as in (4) of Preparation Example 1.

(5) Synthesis of Polymer 4

The following Polymer 4 was prepared by, with chlorobenzene as a solvent, introducing the monomers of the first unit to the third unit with Pd$_2$(dba)$_3$ and P(o-tolyl)$_3$, and polymerizing the result using a microwave reactor.

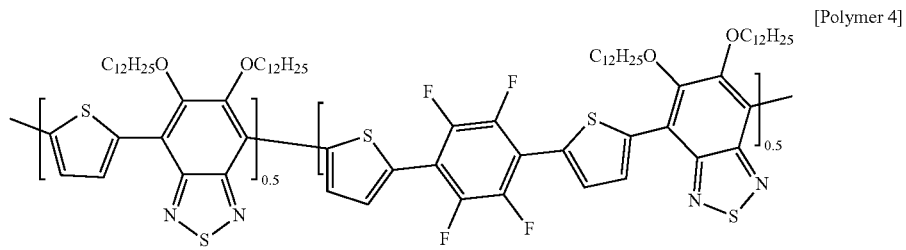

[Polymer 4]

Properties of Polymer 4 are as in the following Table 2.
Preparation Example 5. Synthesis of Polymer 5
(1) Synthesis of Chemical Formula J
Chemical Formula J was synthesized in the same manner as in (1) of Preparation Example 1.
(2) Synthesis of Chemical Formula J-1 (First Unit)
Chemical Formula J-1 was synthesized in the same manner as in (2) of Preparation Example 1.
(3) Synthesis of Chemical Formula K (Second Unit)
Chemical Formula K was synthesized in the same manner as in (3) of Preparation Example 1.
(4) Synthesis of Chemical Formula P (Third Unit)

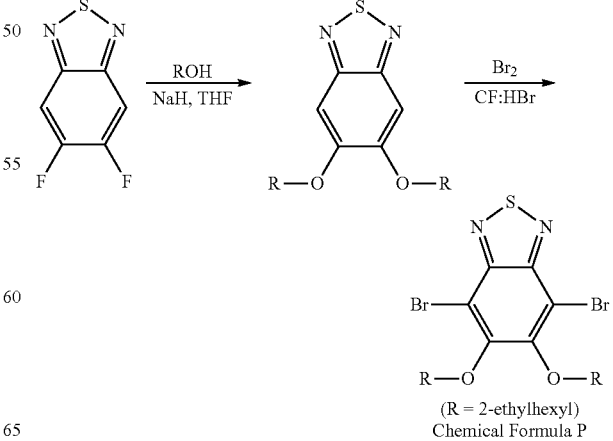

(R = 2-ethylhexyl)
Chemical Formula P

A compound of Chemical Formula P was synthesized based on Journal of Materials Chemistry A: Materials for Energy and Sustainability, 4(47), 18585-18597; 2016.

(5) Synthesis of Polymer 5

The following Polymer 5 was prepared by, with chlorobenzene as a solvent, introducing the monomers of the first unit to the third unit with $Pd_2(dba)_3$ and $P(o-tolyl)_3$, and polymerizing the result using a microwave reactor.

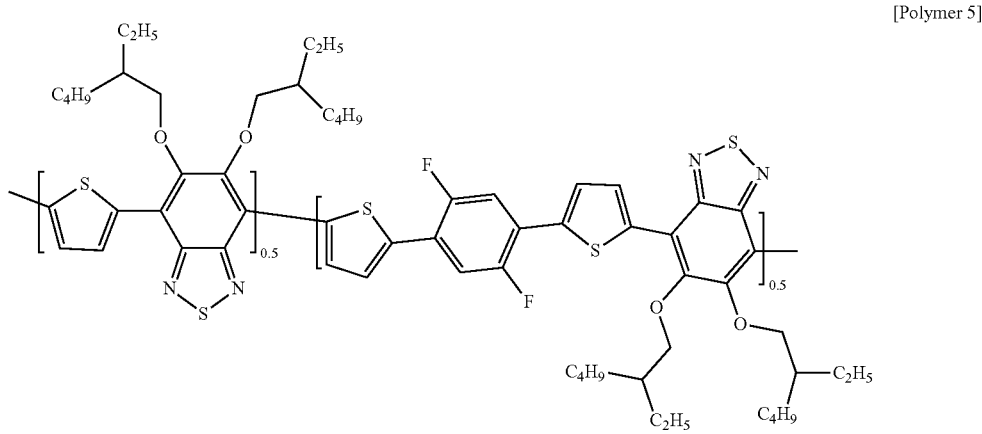

[Polymer 5]

Properties of Polymer 5 are as in the following Table 2.

TABLE 2

| | Mn (Number Average Molecular Weight) | Mw (Weight Average Molecular Weight) | PDI (Molecular Weight Distribution, Mw/Mn) | $UV_{edge}$ (Energy Band Gap in Film) |
|---|---|---|---|---|
| Polymer 2 | 23,000 | 31,000 | 1.348 | 680 |
| Polymer 3 | 21,000 | 26,000 | 1.238 | 678 |
| Polymer 4 | 22,400 | 27,800 | 1.24 | 688 |
| Polymer 5 | 20,500 | 24,700 | 1.205 | 681 |

EXAMPLE

Manufacture of Organic Solar Cell

Example 1-1

Polymer 1 and the following ITIC (Solarmer Materials Inc.) were dissolved in 2 ml of chlorobenzene (CB) in a ratio of 1:2 to prepare a composite solution, and herein, a concentration of the composite solution was adjusted to 2.0 wt %, and an organic solar cell employed a structure of ITO/PEDOT:PSS/photoactive layer/Al (anode/hole transfer layer/photoactive layer/cathode). A glass substrate coated with ITO in a bar-type of 1.5 cm x 1.5 cm was ultrasonic cleaned using distilled water, acetone and 2-propanol, and after the ITO surface was ozone treated for 10 minutes, PEDOT:PSS (AI4083) was spin coated to a thickness of 45 nm, and the result was heat treated for 5 minutes at 235° C. For photoactive layer coating, the composite solution of Polymer 1 and ITIC was spin coated for 10 seconds at 1,500 rpm, and Al was deposited to a thickness of 100 nm at a rate of 1 Å/s using a thermal evaporator under vacuum of $3 \times 10^{-8}$ torr to manufacture an organic solar cell.

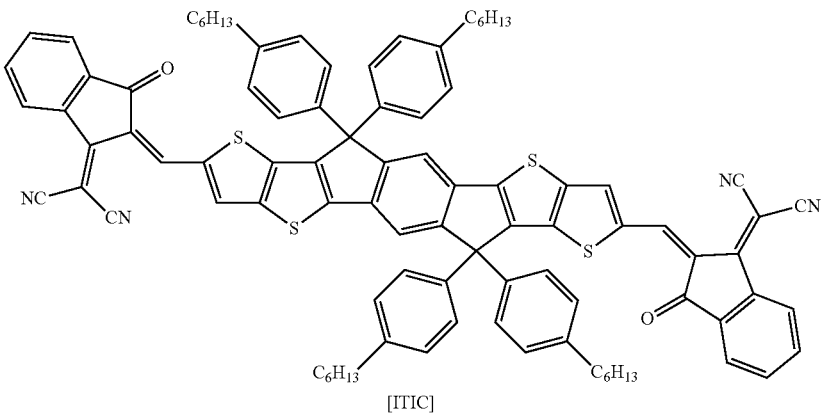

[ITIC]

Example 1-2

An organic solar cell was manufactured in the same manner as in Example 1-1 except that the composite solution of Polymer 1 and ITIC was spin coated for 10 seconds at 2,000 rpm.

Example 1-3

An organic solar cell was manufactured in the same manner as in Example 1-1 except that the composite solution of Polymer 1 and ITIC was spin coated for 10 seconds at 2,500 rpm.

Examples 2-1 to 2-3

Organic solar cells were manufactured in the same manner as in Examples 1-1 to 1-3, respectively, except that Polymer 2 synthesized in Preparation Example 2 was used instead of Polymer 1.

Examples 3-1 to 3-3

Organic solar cells were manufactured in the same manner as in Examples 1-1 to 1-3, respectively, except that Polymer 3 synthesized in Preparation Example 3 was used instead of Polymer 1.

Examples 4-1 to 4-3

Organic solar cells were manufactured in the same manner as in Examples 1-1 to 1-3, respectively, except that Polymer 4 synthesized in Preparation Example 4 was used instead of Polymer 1.

Examples 5-1 to 5-3

Organic solar cells were manufactured in the same manner as in Examples 1-1 to 1-3, respectively, except that Polymer 5 synthesized in Preparation Example 5 was used instead of Polymer 1.

Comparative Example 1

An organic solar cell was manufactured in the same manner as in Example 1-1 except that a composite solution prepared by dissolving the following PTB7-Th and ITIC in 25 mg/ml of orthodichlorobenzene (ODCB) in a ratio of 1:1.3 was used instead of the composite solution of Polymer 1 and ITIC.

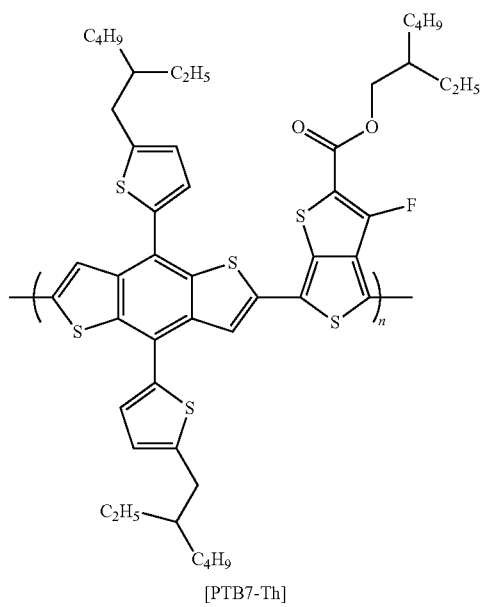

[PTB7-Th]

Comparative Example 2

An organic solar cell was manufactured in the same manner as in Comparative Example 1 except that the composite solution of PTB7-Th and ITIC was coated for 10 seconds at 1,200 rpm.

Comparative Example 3-1

An organic solar cell was manufactured in the same manner as in Example 1-1 except that a composite solution was prepared by dissolving Polymer 1 and PCBM instead of Polymer 1 and ITIC in a ratio of 1:1, the concentration was adjusted to 2.5 wt %, and the spin coating rate of the composite solution was changed to 1,000 rpm.

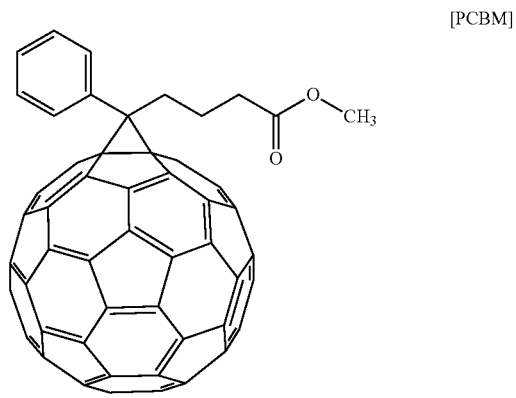

[PCBM]

Comparative Example 3-2

An organic solar cell was manufactured in the same manner as in Comparative Example 3-1 except that the spin coating rate of the composite solution was changed to 1,500 rpm.

Comparative Example 3-3

An organic solar cell was manufactured in the same manner as in Comparative Example 3-1 except that the spin coating rate of the composite solution was changed to 2,000 rpm.

Photoelectric conversion properties of the organic solar cells manufactured in the examples and the comparative examples were measured under a 100 mW/cm² (AM 1.5) condition, and the results are shown in the following Table 3.

TABLE 3

| | Photoactive Layer | Deposition Rate (rpm) | Voc (V) | $J_{SC}$ (mA/cm²) | FF | PCE (%) |
|---|---|---|---|---|---|---|
| Example 1-1 | Polymer 1: | 1,500 | 0.933 | 13.582 | 0.586 | 7.43 |
| Example 1-2 | ITIC = 1:2 | 2,000 | 0.931 | 12.810 | 0.607 | 7.24 |
| Example 1-3 | | 2,500 | 0.921 | 11.043 | 0.595 | 6.06 |
| Example 2-1 | Polymer 2: | 1,500 | 0.914 | 13.119 | 0.618 | 7.41 |
| Example 2-2 | ITIC = 1:2 | 2,000 | 0.916 | 13.180 | 0.621 | 7.50 |
| Example 2-3 | | 2,500 | 0.907 | 12.762 | 0.597 | 6.91 |
| Example 3-1 | Polymer 3: | 1,500 | 0.938 | 13.007 | 0.587 | 7.16 |
| Example 3-2 | ITIC = 1:2 | 2,000 | 0.932 | 13.197 | 0.583 | 7.17 |
| Example 3-3 | | 2,500 | 0.925 | 12.076 | 0.566 | 6.32 |
| Example 4-1 | Polymer 4: | 1,500 | 0.919 | 13.054 | 0.569 | 6.82 |
| Example 4-2 | ITIC = 1:2 | 2,000 | 0.924 | 13.258 | 0.578 | 7.08 |
| Example 4-3 | | 2,500 | 0.913 | 12.538 | 0.568 | 6.50 |
| Example 5-1 | Polymer 5: | 1,500 | 0.916 | 13.335 | 0.595 | 7.27 |
| Example 5-2 | ITIC = 1:2 | 2,000 | 0.905 | 13.639 | 0.586 | 7.23 |
| Example 5-3 | | 2,500 | 0.901 | 12.889 | 0.598 | 6.95 |
| Comparative Example 1 | PTB7-Th: ITIC = 1:1.3 | 1,500 | 0.640 | 10.381 | 0.530 | 3.52 |
| Comparative Example 2 | | 1,200 | 0.623 | 11.267 | 0.426 | 2.99 |
| Comparative Example 3-1 | Polymer 1: PCBM = 1:1 | 1,000 | 0.869 | 9.361 | 0.608 | 4.95 |
| Comparative Example 3-2 | | 1,500 | 0.876 | 9.872 | 0.651 | 5.63 |
| Comparative Example 3-3 | | 2,000 | 0.876 | 9.050 | 0.661 | 5.24 |

FIG. 2 is a diagram presenting voltage-dependent current density of the organic solar cells of Examples 1-1 to 1-3, and FIG. 3 is a diagram presenting voltage-dependent current density of the organic solar cells of Comparative Examples 1 and 2. In Table 3, $V_{oc}$ means an open circuit voltage, $J_{sc}$ means a short-circuit current, FF means a fill factor, and PCE means energy conversion efficiency. The open circuit voltage and the short-circuit current are each an x-axis and a y-axis intercept in the four quadrants of a voltage-current density curve, and as these two values increase, solar cell efficiency is preferably enhanced. In addition, the fill factor is a value dividing the rectangle area that may be drawn inside the curve by the product of the short-circuit current and the open circuit voltage. The energy conversion efficiency may be obtained when these three values are divided by intensity of the irradiated light, and it is preferred as the value is higher.

In Table 3, it was seen that the organic solar cells including the polymer according to one embodiment of the present disclosure as an electron donor and including a non-fullerene-based compound as an electron acceptor had a higher open circuit voltage, had excellent device efficiency, and had excellent energy conversion efficiency compared to the organic solar cells of Comparative Examples 1 and 2 including PTB7-Th as an electron donor and the organic solar cells of Comparative Examples 3-1 to 3-3 including a fullerene-based compound as an electron acceptor. Specifically, it was identified that, while energy conversion efficiency of the examples of the present application appeared to be 6% or higher and preferably 7% or higher, the energy conversion efficiency of the comparative examples was measured to be less than 6%.

What is claimed is:

1. An organic solar cell comprising:
   a first electrode;
   a second electrode on the first electrode; and
   one or more organic material layers between the first electrode and the second electrode, wherein the one or more organic material layers include a photoactive layer,
   wherein the photoactive layer includes an electron donor and an electron acceptor,
   the electron acceptor includes a non-fullerene-based compound, and
   the electron donor includes a polymer comprising a first unit of Chemical Formula 1, a second unit of Chemical Formula 2, and a third unit of Chemical Formula 3:

[Chemical Formula 1]

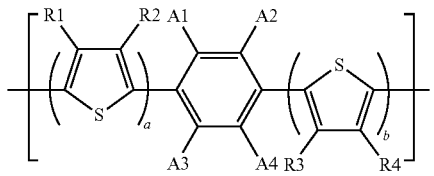

[Chemical Formula 2]

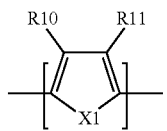

[Chemical Formula 3]

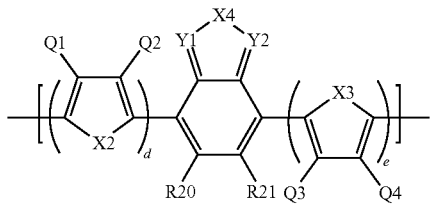

wherein:
X1 to X4 are the same as or different from each other, and are each independently selected from the group consisting of CRR', NR, O, SiRR', PR, S, GeRR', Se and Te;
Y1 and Y2 are the same as or different from each other, and are each independently selected from the group consisting of CR'', N, SiR'', P and GeR'';
R, R', R'', Q1 to Q4, R1 to R4, R10 and R11 are the same as or different from each other, and are each independently hydrogen, deuterium, a halogen group, a nitrile group, a nitro group, a hydroxyl group, a substituted or unsubstituted alkyl group, a substituted or unsubstituted cycloalkyl group, a substituted or unsubstituted alkoxy group, a substituted or unsubstituted aryloxy group, a substituted or unsubstituted alkenyl group, a substituted or unsubstituted aryl group, or a substituted or unsubstituted heterocyclic group;
R20 and R21 are the same as or different from each other, and are each independently a substituted or unsubstituted alkoxy group or a substituted or unsubstituted aryloxy group;
a and b are the same as or different from each other, and are each an integer of 1 to 3;
d and e are the same as or different from each other, and are each an integer of 0 to 3;
when a, b, d or e is 2 or greater, structures in the two or more parentheses are the same as or different from each other; and A1 to A4 are the same as or different from each other, and are each independently hydrogen, fluorine or chlorine, and at least one of A1 to A4 is fluorine or chlorine.

2. The organic solar cell of claim 1, wherein the non-fullerene-based compound is a compound of Chemical Formula A:

[Chemical Formula A]

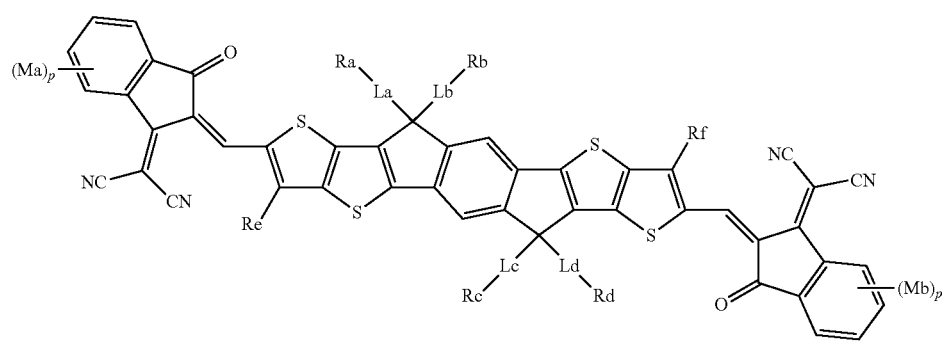

wherein:

Ra to Rf are the same as or different from each other, and are each independently hydrogen or a substituted or unsubstituted alkyl group;

La to Ld are the same as or different from each other, and are each independently a substituted or unsubstituted arylene group or a substituted or unsubstituted divalent heterocyclic group;

Ma and Mb are the same as or different from each other, and are each independently hydrogen, a halogen group, or a substituted or unsubstituted alkyl group;

p and q are the same as or different from each other, and are each independently an integer of 0 to 2; and when p or q is 2, structures in the parentheses are the same as each other.

3. The organic solar cell of claim 2, wherein the compound of Chemical Formula A is any one of the following Chemical Formulae A-1 to A-5:

[Chemical Formula A-1]

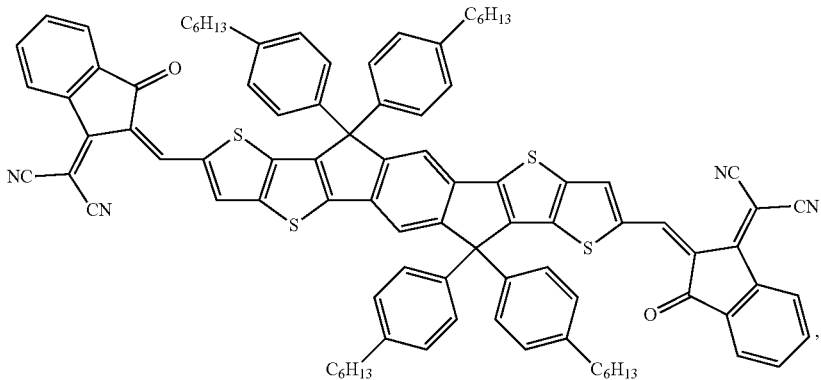

[Chemical Formula A-2]

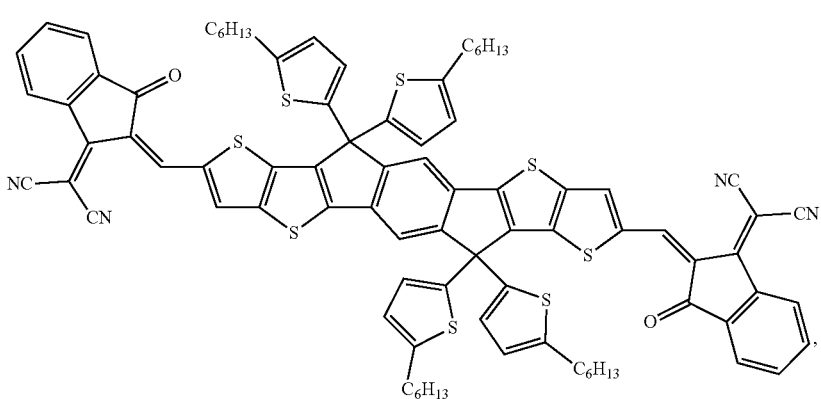

-continued
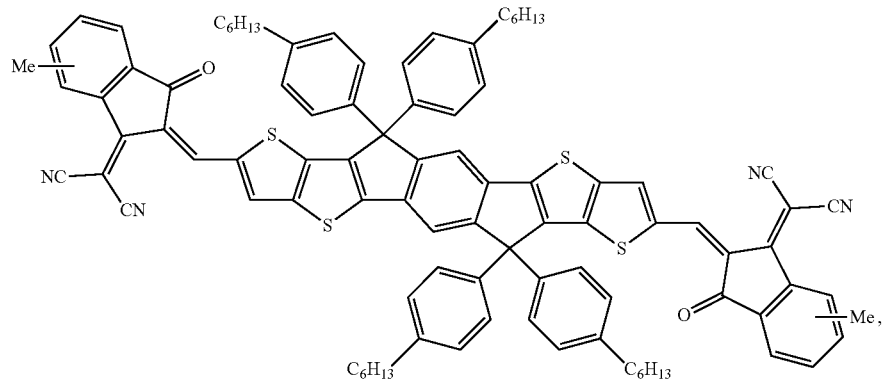
[Chemical Formula A-3]
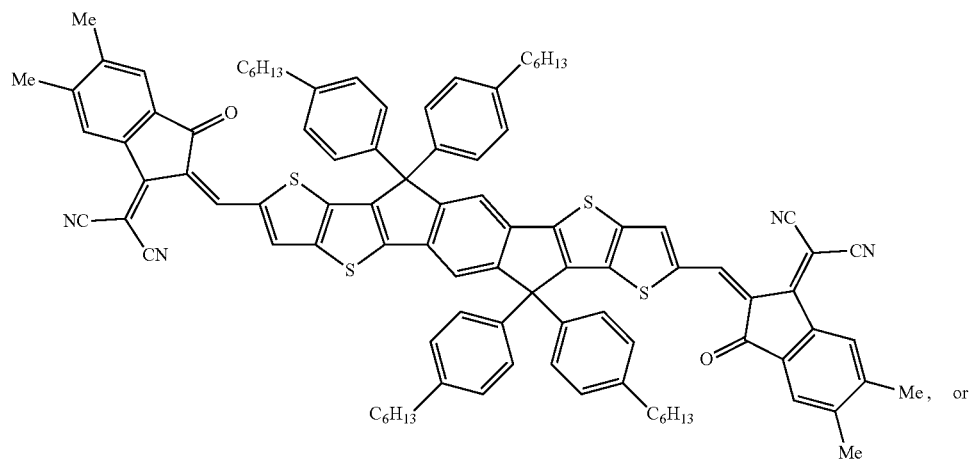
[Chemical Formula A-4]
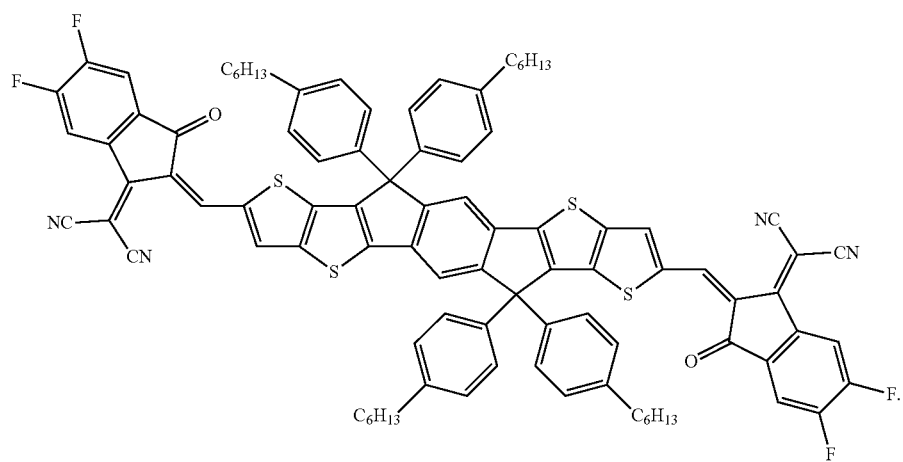
[Chemical Formula A-5]

4. The organic solar cell of claim 1, wherein the second unit of Chemical Formula 2 is a unit of Chemical Formula 2-1:

[Chemical Formula 2-1]

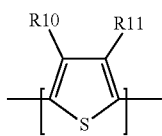

wherein:
R10 and R11 have the same definitions as in Chemical Formula 2.

5. The organic solar cell of claim 1, wherein the third unit of Chemical Formula 3 is a unit of Chemical Formula 3-1 or Chemical Formula 3-2:

[Chemical Formula 3-1]

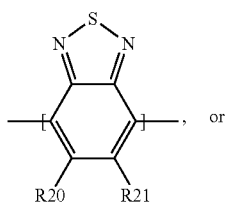, or

[Chemical Formula 3-2]

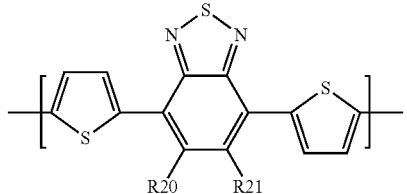

wherein:
R20 and R21 have the same definitions as in Chemical Formula 3.

6. The organic solar cell of claim 1, wherein the polymer comprises a unit of Chemical Formula 4:

[Chemical Formula 4]

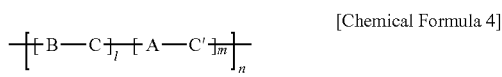

wherein:
l is, as a mole fraction, a real number of 0<l<1;
m is, as a mole fraction, a real number of 0<m<1;
l+m=1;
A is the first unit of Chemical Formula 1;
B is the second unit of Chemical Formula 2;
C and C' are the same as or different from each other, and are each independently the third unit of Chemical Formula 3; and
n is, as a unit repetition number, an integer of 1 to 10,000.

7. The organic solar cell of claim 1, wherein the polymer comprises a unit of any one of the following Chemical Formulae 5-1 to 5-4:

[Chemical Formula 5-1]

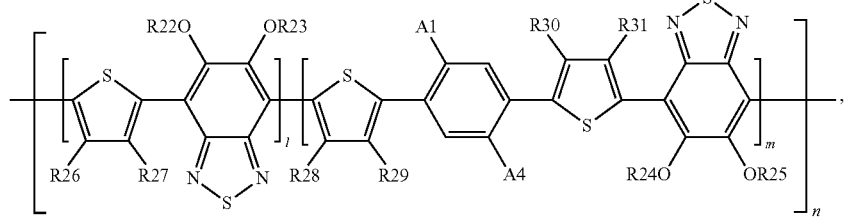,

[Chemical Formula 5-2]

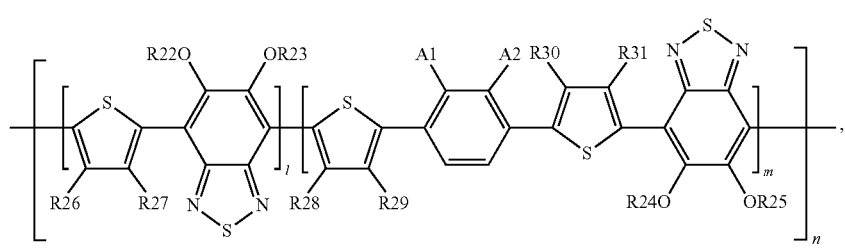,

[Chemical Formula 5-3]

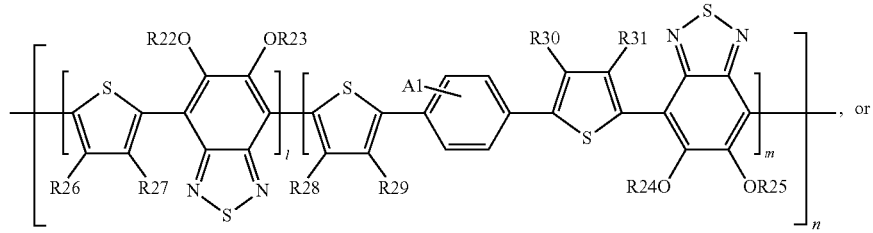, or

-continued

[Chemical Formula 5-4]

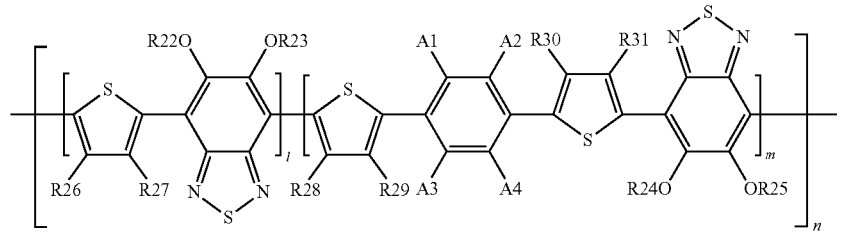

wherein:

R22 to R25 are the same as or different from each other, and are each independently a substituted or unsubstituted alkyl group or a substituted or unsubstituted aryl group;

R26 to R31 are the same as or different from each other, and are each independently hydrogen or a substituted or unsubstituted alkyl group;

A1 to A4 have the same definitions as in Chemical Formula 1;

l is, as a mole fraction, a real number of 0<l<1;
m is, as a mole fraction, a real number of 0<m<1;
l+m=1; and
n is, as a unit repetition number, an integer of 1 to 10,000.

8. The organic solar cell of claim 1, wherein the polymer comprises a unit of any one of the following Chemical Formulae 6-1 to 6-5:

[Chemical Formula 6-1]

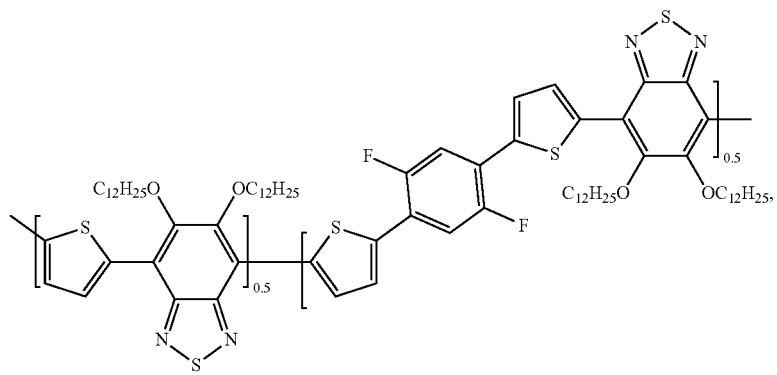

[Chemical Formula 6-2]

[Chemical Formula 6-3]

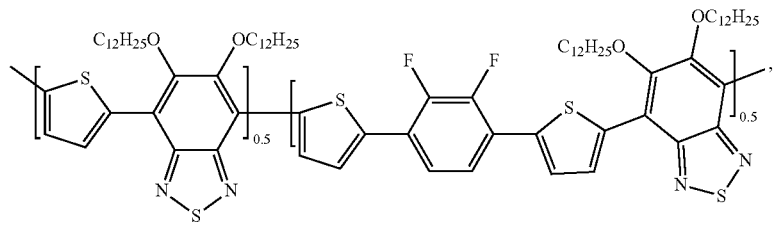

[Chemical Formula 6-4]

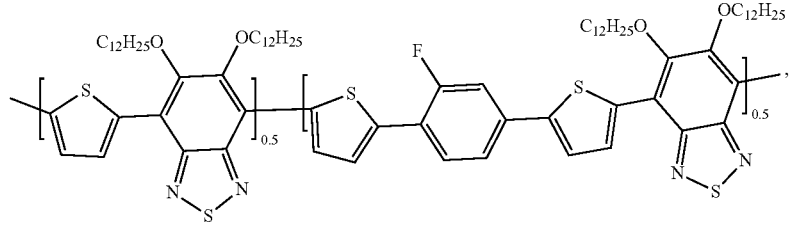

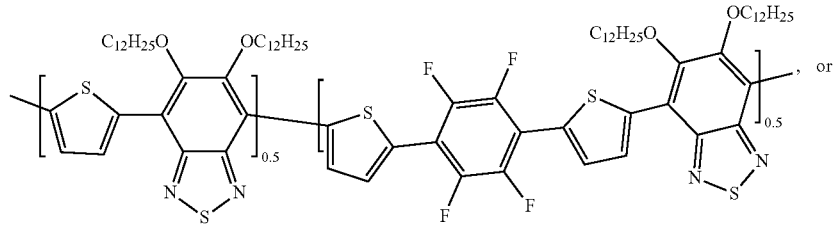

-continued

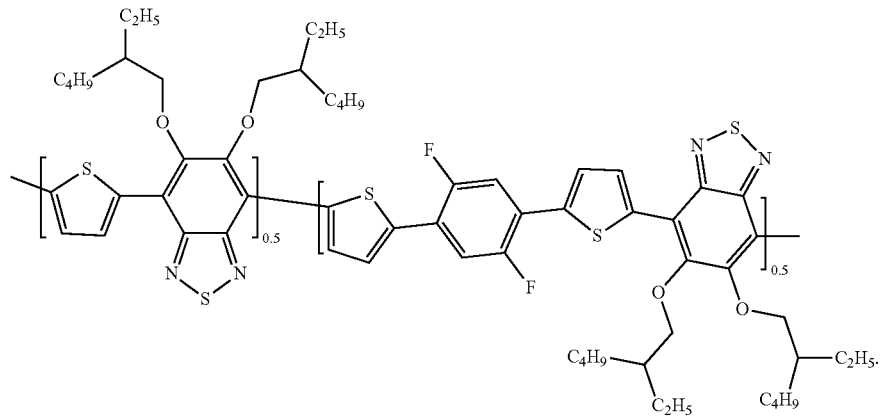

9. The organic solar cell of claim 1, wherein the electron donor and the electron acceptor have a mass ratio of 1:1 to 1:4 (electron donor:electron acceptor).

10. The organic solar cell of claim 1, wherein the non-fullerene-based compound is a compound of Chemical Formula A-1:

[Chemical Formula A-1]

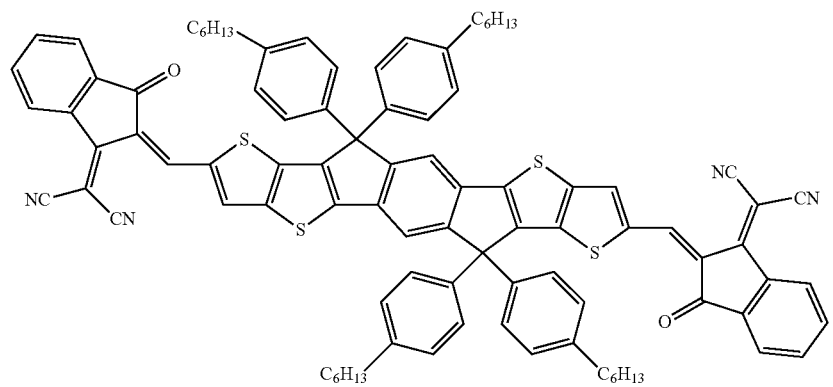

11. The organic solar cell of claim 1, wherein the non-fullerene-based compound is a compound of Chemical Formula A-2:

[Chemical Formula A-2]

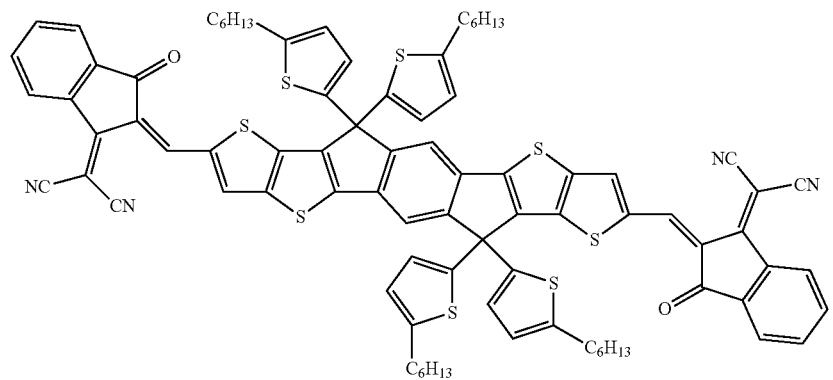

12. The organic solar cell of claim 1, wherein the non-fullerene-based compound is a compound of Chemical Formula A-3:

[Chemical Formula A-3]

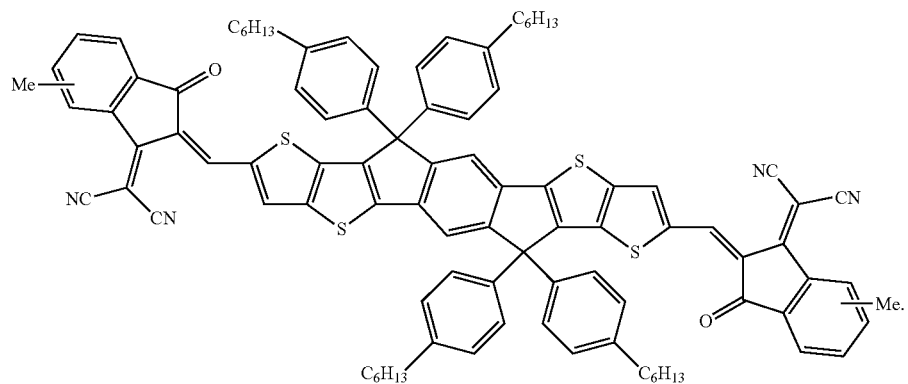

13. The organic solar cell of claim 1, wherein the non-fullerene-based compound is a compound of Chemical Formula A-4:

[Chemical Formula A-4]

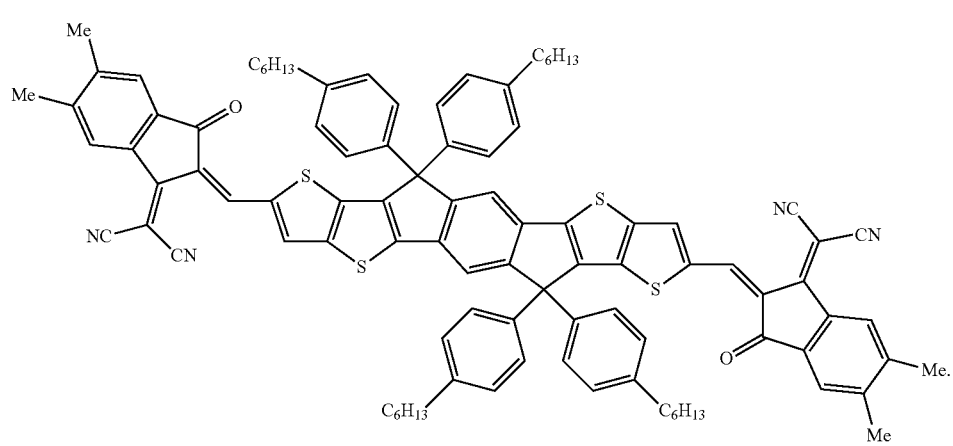

14. The organic solar cell of claim 1, wherein the non-fullerene-based compound is a compound of Chemical Formula A-5:

[Chemical Formula A-5]

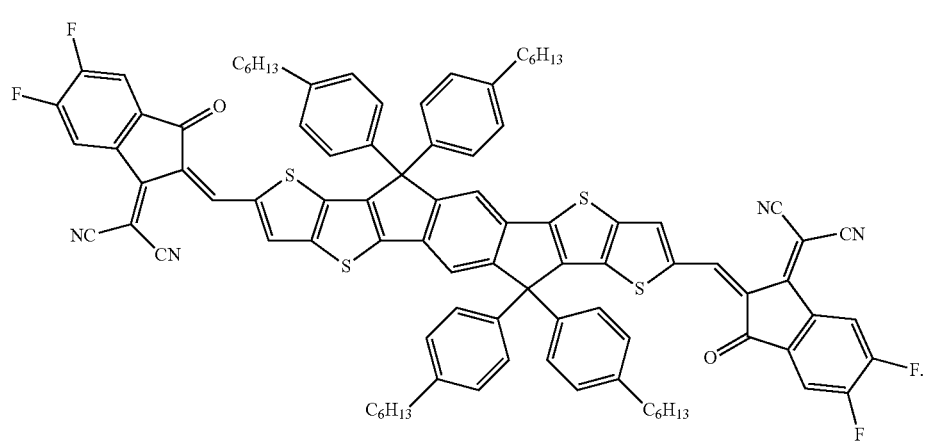

15. The organic solar cell of claim 1, wherein the third unit of Chemical Formula 3 is a unit of Chemical Formula 3-1:

[Chemical Formula 3-1]

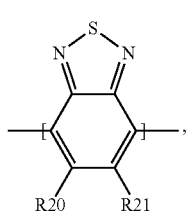

wherein R20 and R21 have the same definitions as in Chemical Formula 3.

16. The organic solar cell of claim 1, wherein the third unit of Chemical Formula 3 is a unit of Chemical Formula 3-2:

[Chemical Formula 3-2]

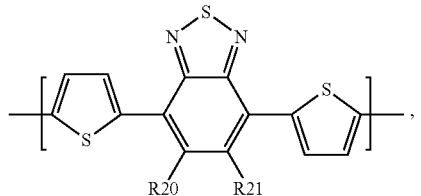

wherein R20 and R21 have the same definitions as in Chemical Formula 3.

17. The organic solar cell of claim 1, wherein the polymer comprises a unit of Chemical Formula 5-1:

[Chemical Formula 5-1]

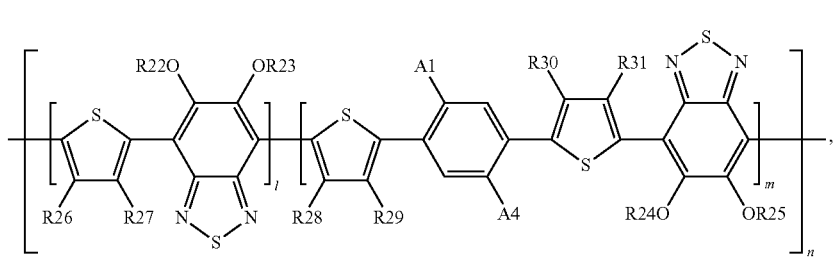

wherein:
R22 to R25 are the same as or different from each other, and are each independently a substituted or unsubstituted alkyl group or a substituted or unsubstituted aryl group;
R26 to R31 are the same as or different from each other, and are each independently hydrogen or a substituted or unsubstituted alkyl group;
A1 and A4 have the same definitions as in Chemical Formula 1;
l is, as a mole fraction, a real number of $0<l<1$;
m is, as a mole fraction, a real number of $0<m<1$;
$l+m=1$; and
n is, as a unit repetition number, an integer of 1 to 10,000.

18. The organic solar cell of claim 1, wherein the polymer comprises a unit of Chemical Formulae 5-2:

[Chemical Formula 5-2]

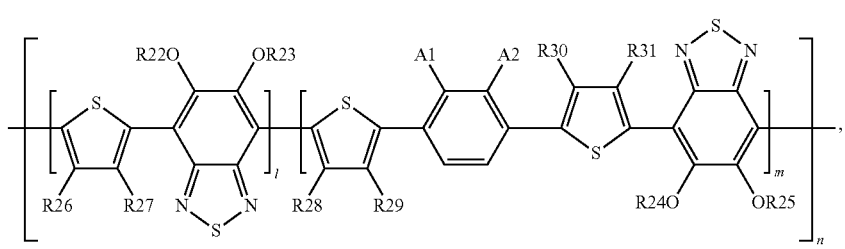

wherein:
R22 to R25 are the same as or different from each other, and are each independently a substituted or unsubstituted alkyl group or a substituted or unsubstituted aryl group;
R26 to R31 are the same as or different from each other, and are each independently hydrogen or a substituted or unsubstituted alkyl group;
A1 and A2 have the same definitions as in Chemical Formula 1;
l is, as a mole fraction, a real number of 0<l<1;
m is, as a mole fraction, a real number of 0<m<1;
l+m=1; and
n is, as a unit repetition number, an integer of 1 to 10,000.

19. The organic solar cell of claim 1, wherein the polymer comprises a unit of Chemical Formulae 5-3:

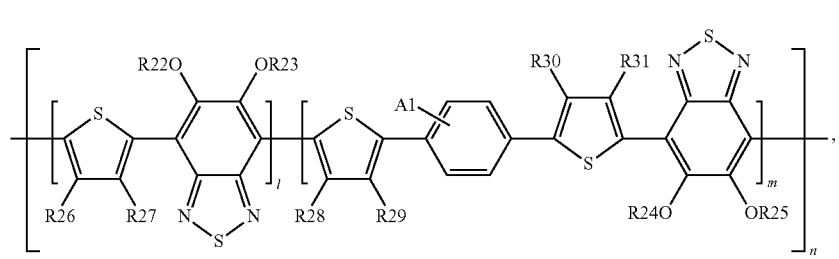

[Chemical Formula 5-3]

wherein:
R22 to R25 are the same as or different from each other, and are each independently a substituted or unsubstituted alkyl group or a substituted or unsubstituted aryl group;
R26 to R31 are the same as or different from each other, and are each independently hydrogen or a substituted or unsubstituted alkyl group;
A1 has the same definitions as in Chemical Formula 1;
l is, as a mole fraction, a real number of 0<l<1;
m is, as a mole fraction, a real number of 0<m<1;
l+m=1; and
n is, as a unit repetition number, an integer of 1 to 10,000.

20. The organic solar cell of claim 1, wherein the polymer comprises a unit of Chemical Formulae 5-4:

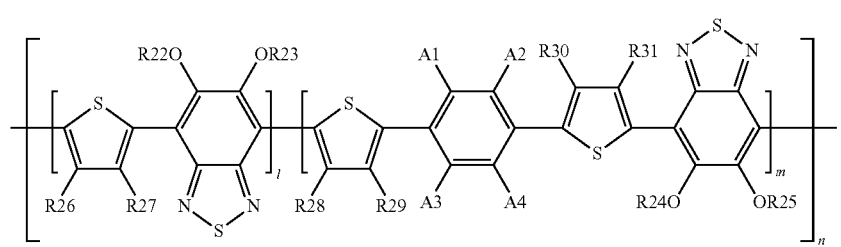

[Chemical Formula 5-4]

wherein:
R22 to R25 are the same as or different from each other, and are each independently a substituted or unsubstituted alkyl group or a substituted or unsubstituted aryl group;
R26 to R31 are the same as or different from each other, and are each independently hydrogen or a substituted or unsubstituted alkyl group;
A1 to A4 have the same definitions as in Chemical Formula 1;
l is, as a mole fraction, a real number of 0<l<1;
m is, as a mole fraction, a real number of 0<m<1;
l+m=1; and
n is, as a unit repetition number, an integer of 1 to 10,000.

* * * * *

UNITED STATES PATENT AND TRADEMARK OFFICE
CERTIFICATE OF CORRECTION

PATENT NO. : 11,133,479 B2
APPLICATION NO. : 16/477415
DATED : September 28, 2021
INVENTOR(S) : Choi et al.

Page 1 of 1

It is certified that error appears in the above-identified patent and that said Letters Patent is hereby corrected as shown below:

In the Claims

Column 36, Line 20, Claim 2, Chemical Formula A:
Please correct "$(Mb)_p$" to read -- $(Mb)_q$ --

Column 49, Lines 14-15, Claim 18:
Please correct "1 to b 10,000." to read -- 1 to 10,000. --

Signed and Sealed this
Fifteenth Day of February, 2022

Drew Hirshfeld
*Performing the Functions and Duties of the*
*Under Secretary of Commerce for Intellectual Property and*
*Director of the United States Patent and Trademark Office*